United States Patent
Kim et al.

(10) Patent No.: US 8,448,150 B2
(45) Date of Patent: May 21, 2013

(54) SYSTEM AND METHOD FOR TRANSLATING HIGH-LEVEL PROGRAMMING LANGUAGE CODE INTO HARDWARE DESCRIPTION LANGUAGE CODE

(75) Inventors: Seon Wook Kim, Namyangju (KR); Thi Huong Giang Nguyen, Seoul (KR)

(73) Assignee: Korea University Industrial & Academic Collaboration Foundation, Seoul (KR)

( * ) Notice: Subject to any disclaimer, the term of this patent is extended or adjusted under 35 U.S.C. 154(b) by 758 days.

(21) Appl. No.: 12/609,604

(22) Filed: Oct. 30, 2009

(65) Prior Publication Data
US 2010/0131934 A1 May 27, 2010

Related U.S. Application Data

(63) Continuation-in-part of application No. 12/392,463, filed on Feb. 25, 2009, now Pat. No. 8,336,036.

(30) Foreign Application Priority Data

Nov. 21, 2008 (KR) .................. 10-2008-0116417

(51) Int. Cl.
*G06F 9/45* (2006.01)
(52) U.S. Cl.
USPC ........................ 717/136; 717/140; 717/162
(58) Field of Classification Search
None
See application file for complete search history.

(56) References Cited

U.S. PATENT DOCUMENTS

2008/0141227 A1* 6/2008 Waters et al. ................ 717/140

OTHER PUBLICATIONS

Gokhale et al. "NAPA C: Compiling for a Hybrid RISC/FPGA Architecture".
Gokhale et al. "A Malleable Architecture Generator for FPGA Computing" SPIE vol. 2914, pp. 208-217.
Böhm et al. "Mapping a Single Assignment Programming Language to Reconfigurable Systems" The Journal of Supercomputing, 21, pp. 117-130, 2002.
Li et al. "Hardware-Software Co-Design of Embedded Reconfigurable Architectures" pp. 507-512.
Bondalapati et al. "DEFACTO: A Design Environment for Adaptive Computing Technology".

* cited by examiner

*Primary Examiner* — Chuck Kendall
(74) *Attorney, Agent, or Firm* — Rabin & Berdo, P.C.

(57) ABSTRACT

The present invention is directed to a method and system for translating a high-level language (HLL) code such as C, C++, Fortran, Java or the like into a HDL code such as Verilog or VHDL which requires no modification in the original HLL source code, while supporting a cross call between software and hardware, and even recursive calls in hardware. The system includes: a HLL-to-HLL source translator which reads user programming directive from a translation-targeted high-level language code marked with the user directive, and separates the translation-targeted high-level language code into a hardware code part and a software code part; a main compiler which compiles the software code part; a HLL-to-HDL translator which includes the front-end and middle-end of the main compiler and a HDL backend; a main core which executes the compiled software code part; and a dedicated hardware which executes the HDL code.

45 Claims, 15 Drawing Sheets

FIG.8

```
//enable_bb[i]=1:module i is enabled
//finish_bb[i]=1:module i finished its execution
//successor[i]:the taken or not taken value of module i branch
always@(posedge clk or negedge reset)
begin
    ...
    case(pc)
        0 begin
                    enable_bb<=4'b0001; // enable module 0
                    pc <= 1;
          end
        1 pc <= 2;
        2    //decide the next module after module 0 branch
          if(successor[0])
          begin
                    enable_bb <= 4'b1000;
                    pc <= 6;
          end
          else begin
                    enable_bb <= 4'b0001;
                    pc <= 3;
          end
        3 pc <= 4; // wait for block module 1
        4 begin
                    enable_bb <= 4'b0100;
                    pc <= 5;
          end
        5 if(finish_bb[2])
          begin
                if(successor[2])
                begin
                    enable_bb<=4'b0100; // backward jump
                    pc <= 5;
                end
                else begin
                    enable_bb <= 4'b1000;
                    pc <= 6;
                end
          end
          else pc <=5;
        6 if(finish_bb[3])
          begin
                    pc <= 7;
                    finish <=1;              //the function finished
                    enable_bb <= 4'b0000;    //stop all block modules
          end
          else begin
                    pc <= 6;
                    enable_bb <= 4'b1000;
          end
        7 begin
                    pc <= 7;
                    finish <=0;
          end
    endcase
end
```

FIG.9

```
always@(posedge clk or negedge reset)
begin
 ........
 if(enable) begin
  pc <= 2;
  enable_bb = 6'b0;
 end
 else begin
  case(pc)
   2: begin
    enable_bb = 6'b000100;
    pc = 7;
   end
   7:pc = 3;
   3:begin
    enable_bb = 6'b001000;
    pc = 8;
   end
   8:pc = 4;
   4:begin
    enable_bb = 6'b010000;
    pc = 9;
   end
   9: pc = finish_bb[4]?10:9;
   10:
    if(successor[4])  pc=4;
    else pc=5;
   5:begin
    enable_bb = 6'b100000;
    pc = 11;
   end
   11: pc = finish_bb[5]?12:11;
   12:
    if(successor[5])  pc=3;
    else pc=6;
   6:/*Send interrupt signal to SW
    & wait for its response*/
    ........
  endcase
 end
```

Control Unit

```
module rtl2verilog(
 ......
 );
 /*Variable declarationd*/
 wire signed [31:0] regs0_in_4;
 wire signed [31:0] regs1_in_4;
 wire signed [31:0] regs3_in_3;
 wire signed [31:0] regs4_in_3;
 /*Assign input signal to block module input signal*/
 assign regs8_in_2=atg1;
 assign regs8_in_2=atg2;
 assign regs8_in_3=successor[5]?regs3_out_5:regs3_out_2;
 assign regs8_in_3=successor[5]?regs4_out_5:regs3_out_2;
 assign regs8_in_3=successor[5]?regs0_out_4:regs3_out_3;
 assign regs8_in_3=successor[5]?regs1_out_4:regs3_out_3;
 ......
 /*Create block module instances*/
 block_module_2bb_2(/*output*/regs3_out_2,regs4_out_2,
 regs6_out_2,/*input*/regs8_in_2,regs9_in_2,clk,reset,
 enable_bb[2]);
 block_module_3bb_3(/*output*/regs0_out_3,regs1_out_3,/*
 input*/regs3_in_3,regs4_in_3,clk,reset,enable_bb[3]);
 block_module_4bb_4(/*output*/regs3_out_4,regs0_out_4/*
 regs1_out_4,regs2_out_4,regs1_in_4,regs2_in_4,successor[4]./
 *input*/regs0_in_4,regs1_in_4,regs2_in_4,regs3_in_4.,clk,reset.
 enable_cc[4]);
```

Control unit

Top module

FIG.14

```
int max(int a, int b, int c, int d, int e)
{ ...... } pragma hardware function
int min(int a, int b, int c, int d, int e)
{ ...... } int arr[10];
int main(void)
{
    int i,
    int a, b, c, d, e;
#pragma hardware for
    for(i=0; i<10; i+=2){
        arr[i]   + max(a, b, c, d, e);
        arr[i+1] + min(a, b, c, d, e);
    }
    return 0;
}
```

Annotated original C code

⇒ C-to-C translator

```
int max(int a, int b, int c, int d, int e)
{ ...... } int arr[10];
int main(void){
    int a, b, c, d, e;
    wrapper (1, 5, a, b, c, d, e);
    return 0;
} void hw_func_1(int a, int b, int c, int d, int e){
    int i;
    for(i=0; i<10; i+=2){
        arr[i]   = max(a, b, c, d, e);
        arr[i+1] = hw_func_2(a, b, c, d, e);
    }
} int hw_func_2(int a, int b, int c, int d, int e){
    ......
}
```

Preprocessed code (a) Software-to-Hardware 흐름

(b) Hardware call software

SYSTEM AND METHOD FOR TRANSLATING HIGH-LEVEL PROGRAMMING LANGUAGE CODE INTO HARDWARE DESCRIPTION LANGUAGE CODE

CROSS-REFERENCE TO RELATED APPLICATION

This application claims the benefit of Korean Application No. 10-2008-0116417, filed on Nov. 21, 2008, with the Korean Intellectual Property Office, and U.S. patent application Ser. No. 12/392,463, filed on Feb. 25, 2009, with the USPTO, the disclosure of which is incorporated herein by reference.

BACKGROUND OF THE INVENTION

1. Field of the Invention

The present invention relates to a system and method for translating a high-level programming language (HLL) code, such as C, C++, Fortran, Java, etc., into Hardware Description Languages (HDL) code such as Verilog or VHDL. More particularly, the present invention relates to a system and method for translating high-level language codes into HDL codes by using a HDL backend attached to the main compiler (i.e. compilers for HLLs). The HDL code is then synthesized to cooperate with a main core to accelerate applications. Also, this invention presents innovative and novel techniques to support seamless cross calls between software code running on the main core and hardware code in a dedicated hardware, and even recursive calls inside the hardware.

2. Description of the Related Art

Digital circuit designs have been greatly evolved over the past few decades due to the fast development of semiconductor fabrication technology. At an initial stage, only a few number of logic gates were integrated on one chip, and it is called SSI (Small Scale Integration). The constant development of the technology has led us an era of MSI (Medium Scale Integration) having hundreds of logic gates integrated on one chip, LSI (Large Scale Integration) having thousands of logic gates, and to VLSI (Very Large Scale Integration) having much more than the LSI complexity. Therefore, it becomes more and more popular to use multiple VLSI chips, such as general-purpose processors, DSPs, and ASICs in one design platform.

Programming languages such as Fortran, Pascal, C and the like have been used to develop computer programs for a long time. Similarly, digital circuit designers have felt the necessity of a standardized language to describe digital circuits, which results in HDL (Hardware Description Language). HDL can describe a concurrent procedure corresponding to hardware characteristics and may be represented by Verilog HDL and VHDL. Verilog HDL and VHDL started from Gateway Design Automation and DARPA (Defense Advanced Research Projects Agency), respectively. The digital circuit designers use the HDL for developing digital systems. And the developed HDL codes are synthesized by HDL compilers.

Nowadays many system developers have convincing reasons to add FPGA (Field Programmable Gate Array) to their design platform, and often replace traditional general-purpose processors or DSPs with FPGAs due to its significant computational performance per watt over microprocessors and its design flexibility over ASICs. However, the task of configuring FPGAs with description of HDL requires substantial amount of knowledge in hardware design methods, which makes the potential advantages of the FPGA computing unrealizable to most software developers. Therefore, there is increasing demand for designing hardware at a higher abstraction level such as high-level programming languages without being concerned about hardware-specific details. This approach requires a translation tool that generates the HDL codes from commonly used high-level programming languages (HLL) in software development.

For the purpose of overcoming such a problem, there are many previous researches about tools or methods of translating software programming languages into HDL codes. However, there is a great difference between the programming concepts of hardware and software in translating high-level programming language codes into HDL codes and so it is very difficult to express all software language syntaxes, such as pointers, complex data types (like a structure of a structure, and union in C), two dimensional arrays and so on, in HDL languages. As a result, the currently available conventional tools or methods have many limitations in use. They can support only the translation from system level language codes, such as SystemC, SA-C, Streams-C and the like, into HDL codes, or translation from subsets of high-level languages into HDL with some extension for hardware control.

Moreover, the difference in code generation for hardware and software disallow us to support a cross call between hardware and software, and recursive calls inside hardware. Due to the fact, we should carefully develop an interface code between hardware and software.

SUMMARY OF THE INVENTION

To overcome the above problems and limitations, it is therefore an object of the present invention to provide a method that is capable of translating all syntaxes and semantics of all high-level languages supported by a software main compiler into HDL codes without the need to modify the original high-level language code.

It is another object of the present invention to construct a HLL-to-HDL translator, which is capable of translating all syntaxes and semantics of all high-level languages supported by a software main compiler into HDL codes while utilizing all optimizations already available in a software main compiler for high-level language codes.

It is still another object of the present invention to provide a compilation and execution framework to support cross calls between the software code running on a main core and the generated HDL code running on a dedicated hardware, and recursive function calls of HDL codes inside the dedicated hardware without any limitation.

To achieve the above objects, according to an aspect of the present invention, there is provided a method of translating a high-level language code into a HDL code, comprising the steps of: (1) marking a translation-targeted section of a high-level language code using a programming directive; (2) partitioning the marked translation-targeted section of the high-level language code into a hardware code part and remaining sections of the high-level language code as a software code part; (3) compiling both the software code part and the hardware code part by means of a main compiler and translating the hardware code part into a HDL code by means of a HLL-to-HDL (high-level language to hardware description language) translator; and (4) executing the compiled software code part in a main core and executing the HDL code in a dedicated hardware.

Preferably, the hardware code part in the step (2) includes one or more of subroutines/functions of the high-level language code, and the software code part includes a subroutine/function call statement or a call instruction to the hardware code part.

Preferably, the code compilation process in the step (3) includes: compiling both the software code part and the hardware code part into a target executable code by the main compiler; generating a linking log file containing constant data offset by the main compiler linker; generating a symbol table file containing addresses of all software functions and variables inside the software executable code by the main compiler; and generating the HDL code of the HW code part by the HLL-to-HDL translator by referring to data in the linking log file and the symbol table file.

Preferably, the HLL-to-HDL translator uses the linking log file and the symbol table file for address resolution of the software functions and global variables addresses defined in the SW code part; and uses the linking log file together with the symbol table file to resolve the addresses of string constants and the like inside the HW code part.

Preferably, the translation of the hardware code part into the HDL code by means of the HLL-to-HDL translator in the step (3) comprises the steps of: translating the hardware code part into a low-level intermediate representation (IR) code of the main compiler immediately before generation of a target assembly code; and translating the low-level IR code into the HDL code; while preserving a standard call linkage convention of the main core.

Preferably, the HDL code generated from a subroutine/function of the high-level language code includes a datapath, which is generated by mapping from the low-level IR to HDL exactly same as target assembly code generation, and a control unit, which is generated based on control flow information between basic blocks of the low-level IR code by a HDL code generator inside the HDL back-end, to control the datapath. Preferably, the translation method of a subroutine/function in HLL into HDL is one of: a basic-block-by-basic-block generation method in which the generated HDL code includes one or several block modules as the datapath and a top module as the control unit, or a function-by-function generation method in which the generated HDL code includes one module containing both the datapath and the control unit.

Preferably, in the basic-block-by-basic-block code generation method, the one or more block modules in the datapath perform the same task as the basic blocks of the low-level IR code, and the top module as the control unit creates instances of the one or more block modules, schedules the execution of the one or more block modules by enabling/disabling the one or more block modules.

Preferably, in the basic-block-by-basic-block code generation method, the block modules and the top module are generated in the form of a Finite State Machine (FSM), and one block module is a set of FSM states implementing a sequence of consecutive low-level IR instructions inside a basic block, and the FSM state representation is based on the delay estimation and data/control dependency of the low-level IR instructions.

Preferably, in the basic-block-by-basic-block code generation method, the top module assigns inputs to the one or more block modules, enables one or more block modules at a time, and waits for completion of operation of the enabled block modules, the enabled block modules execute their own codes with the assigned inputs, buffer outputs in their own register sets, and return the outputs buffered in the register sets as well as control flow outcomes to the top module, and the top module decides which of the one or more block modules should be enabled next based on the control flow outcomes.

Preferably, in the function-by-function code generation method, both the datapath and the control unit of a hardware function are included within only one HDL module and implemented as only one Finite State Machine (FSM), the datapath generates output signals of the FSM and the control unit controls the state transition of the FSM, the datapath is constructed from all basic blocks of a HLL function/subroutine and is a set of FSM states generated from the sequence of consecutive low-level IR instructions of basic blocks inside the original HLL subroutine/function, and the FSM state representation is based on the delay estimation and data/control dependency of the low-level IR instructions.

Preferably, in the function-by-function code generation method, the control unit controls the datapath by changing state of the FSM based on control flow information of the translated high-level language subroutine/function.

Preferably, the HDL codes generated from subroutines/functions of the high-level language code in the step (3) share the same memory space including a stack with the compiled software code and follow the software memory layout of the main core, and the shared stack space is used to store spilled values, save register files and a return address, pass function arguments between a caller and callee, etc.

Preferably, the dedicated hardware in the step (4) includes: HWIPs(a set of hardware intellectual properties), each of which is made from the HDL code translated from a HLL subroutine/function and is assigned with a unique HWID (hardware identification number) by the HLL-to-HDL translator; and a hardware controller to control the HWIPs.

Preferably, the hardware controller controls the HWIPs by passing arguments between HWIPs and the main core, and scheduling the execution of HWIPs and the main core through calling control signal among them, and the hardware controller activates one or several HWIPs or the main core at a time depending on the calling sequence among HWIPs and the software running in the main core.

Preferably, in the step (4) the communication interface between the main core and the dedicated hardware can be implemented in two ways which are loose coupling in which the main core is loosely coupled with the dedicated hardware so that the dedicated hardware can communicate with the main core by interrupting, and tight coupling in which the main core is tightly coupled with the dedicated hardware so that the dedicated hardware can directly send control signals to the main core, and vice versa.

Preferably, the step (4) comprises the steps of: executing the compiled software code part in the main core; enabling and passing calling data to the hardware controller inside the dedicated hardware by the main core, if the execution of one or several HWIPs are needed during the execution of the compiled software code part; enabling and passing the calling data to targeted one or several HWIPs by the hardware controller inside the dedicated hardware; executing a code of the enabled one or several HWIPs, updating a result of the execution into memory and system registers, and noticing the hardware controller about its/their finishing by the enabled one or several HWIPs; noticing the main core about the finish of the execution of the one or several HWIPs by the hardware controller; and continuing to execute the compiled software code part with the updated data by the main core. The hardware controller can be another HWIP or the main core.

Preferably, the calling data to be passed from the main core to the dedicated hardware includes: system registers including a stack pointer, a link register, argument registers, and other registers depending on the main core; and control signals including the HWIDs of the target one or several HWIPs and an enable signal.

Preferably, arguments of the targeted one or several HWIPs are passed from the main core using argument registers of the system registers and a shared stack space between the HDL code and the compiled software code part.

Preferably, in the step (4), the main core communicates with and sends control signals to the dedicated hardware by implementing a dedicated instruction in its instruction set architecture (ISA) if the main core and the dedicated hardware are tightly coupled, or calling an API function handling communication tasks if the main core and the dedicated hardware are loosely coupled.

Preferably, when one of the HWIPs inside the dedicated hardware is enabled by the hardware controller, the HWIP reads calling data from registers in the hardware controller if the dedicated hardware and the main core loosely coupled, or otherwise it reads the data directly from the main core.

Preferably, the hardware controller inside the dedicated hardware notices the main core about the finish of the one or several HWIPs by interrupting the main core if the main core and the dedicated hardware are loosely coupled or by sending control signals to the main core if the main core and the dedicated hardware are tightly coupled.

Preferably, a HWIP in the dedicated hardware performs a cross call to the compiled software code part running in the main core, and the calling process comprises the steps of: by the HWIP, preparing calling data and sending control signals to tell the hardware controller that it wants to call the compiled software code part; by the hardware controller, noticing the main core about the call; by the main core, copying the calling data to its own registers, executing the code of the called compiled software code part and noticing the hardware controller when the called compiled software code part finishes; by the hardware controller, noticing the calling HWIP about the finish of the called compiled software code part; and by the HWIP, continuing to execute its code with results from the called compiled software code part.

Preferably, when receiving the control signal from the HWIP, the hardware controller notices the main core about the call by interrupting the main core if the main core and the dedicated hardware are loosely coupled, or directly sending the control signals to the main core if the main core and the dedicated hardware are tightly coupled.

Preferably, when enabled, the main core updates its registers with system registers in the hardware controller and writes software return value and return address to the registers inside the hardware controller when the called compiled software code part finishes if the main core is loosely coupled with the dedicated hardware, or otherwise the main core reads input values directly from the calling HWIP.

Preferably, the HWIP reads the return data and return address of the called compiled software code part from the system registers inside the hardware controller if the dedicated hardware is loosely coupled with the main core, or otherwise, the HWIP reads the values directly from the main core registers.

Preferably, wherein one HWIP in the dedicated hardware performs a call to a different HWIP or itself inside the dedicated hardware, and the calling process comprises the steps of: by the one HWIP, preparing calling data and sending control signals to tell the hardware controller that it wants to call the different HWIP or itself inside the dedicated hardware; by the hardware controller, examining the calling address and enables the different HWIP or the one HWIP; by the different HWIP or the one HWIP, coping the calling data to its registers, executing its code and noticing the hardware controller its finishing time; by the hardware controller, noticing the one HWIP about the finish of the different HWIP or the one HWIP; and by the one HWIP, continuing to execute its code with results from the different HWIP or the one HWIP.

Preferably, the calling data, which need to be passed from the one HWIP to the different HWIP or itself, include the system registers including a stack pointer, a link register, argument registers, return registers and calling control signals including the address of the targeted different HWIP or itself and an enable signal, and if the dedicated hardware and the main core are loosely coupled and all the HWIPs share system registers inside the hardware controller, the one HWIP updates the shared system registers in the hardware controller with the calling data before calling the different HWIP or the one HWIP.

Preferably, the arguments of the different HWIP are passed from the one HWIP through argument registers and a shared stack space between the HWIPs.

Preferably, when enabled, the different HWIP updates its registers with system registers in the hardware controller if the dedicated hardware and the main core are loosely coupled and all the HWIPs share a set of system registers inside the hardware controller or otherwise the different HWIP reads values directly from the one HWIP.

Preferably, when the different HWIP finishes, the different HWIP writes its return value and return address to registers inside the hardware controller if the dedicated hardware and the main core are loosely coupled and all the HWIPs share system registers inside the hardware controller.

Preferably, the one HWIP reads the return data and return address from the registers in the hardware controller if the dedicated hardware and the main core are loosely coupled inside the hardware controller and all the HWIPs share system registers inside the hardware controller, or otherwise the one HWIP reads the values directly from the different HWIP registers.

According to another embodiment of the present invention, there is provided a system for translating a high-level language code into a HDL code includes: a HLL-to-HLL source translator which reads a programming directive from a translation-targeted high-level language code, and separates the translation-targeted high-level language code into a hardware code part and a software code part; a main compiler which compiles both the software code part and the hardware code part together; a HLL-to-HDL translator which translates the hardware code part into HDL code, the translated HDL code of a function/subroutine in the high-level language code includes a datapath and a control unit; a main core which executes the compiled software code part; and a dedicated hardware which executes the HDL code in cooperation with the main core.

Preferably, the hardware code part includes one or a several subroutines/functions of the translation-targeted high-level language code, and the software code part includes the remaining parts of the translation-targeted high-level language code, and function calls to the hardware code part.

Preferably, the HLL-to-HDL translator includes the main compiler front-end and middle-end, and a HDL backend such that the HLL-to-HDL translator naturally follows a linkage convention of the compiled software code part in the HDL code generation, and the HDL backend includes a mapping from low-level IR into HDL exactly same as the target assembly code generation (for example, using a machine description file in GCC), whose syntax follows a HDL syntax and semantics, and a HDL code generator.

Preferably, the main compiler front-end and middle-end of the HLL-to-HDL translator translate the hardware code part into a low-level IR code, and the HDL backend of the HLL-to-HDL translator translates the low-level IR code into the HDL code.

Preferably, the HDL code of a function/subroutine in the high-level language code is generated using a basic-block-by-basic-block generation method in which the generated HDL code includes one or several block modules as the datapath and a top module as the control unit, or a function-by-function generation method in which the generated HDL code includes one module containing both the datapath and the control unit.

Preferably, the datapath of a hardware function of the HDL code is generated directly from the low-level IR code by mapping into HDL inside the HDL back-end exactly same as the target assembly code generation (for example, using a machine description file in GCC), the control unit of the hardware function is generated by a HDL code generator based on control dependence between basic blocks of the low-level IR code, and the datapath and the control unit are implemented using FSM form.

Preferably, in the basic-block-by-basic-block code generation method, a block module is a set of FSM states generated from a sequence of consecutive low-level IR instructions inside a basic block, the FSM state representation is based on the delay estimation and data/control dependency of the low-level IR instructions, the block module performs same task as a basic block of the low-level IR code, and the top module schedules the execution of the one or more block modules by enables/disables the one or more block modules.

Preferably, in the basic-block-by-basic-block code generation method, the top module assigns inputs to block modules and enables one or several block modules at a time and waits for the completion of the enabled block modules, the enabled block modules execute their own codes with the assigned inputs, buffer outputs in their own register sets, and return the buffered outputs in the register sets as well as their control flow outcomes to the top module, and the top module decides which of the one or more block modules should be executed next based on the control flow outcome of the previous enabled block modules.

Preferably, in the function-by-function code generation method, both the datapath and the control unit of the HDL code generated from a function/subroutine of the high-level language code are included within only one module, and implemented as only one FSM, the datapath generates output logic of the FSM while the control unit controls the state transition of the FSM, the datapath is a set of FSM states generated from the sequence of consecutive low-level IR instructions of all basic blocks inside the HLL function/subroutine, and the FSM state representation is based on the delay estimation and data/control dependency of the low-level IR instructions.

According to still another embodiment of the present invention, there is provided a system for translating a high-level language code into a HDL code using a HLL-to-HDL translator, the HLL-to-HDL translator including: a main compiler front-end and middle-end; and a HDL backend.

Preferably, the HDL backend includes: a translator to map from the low-level IR to HDL, exactly same as the target assembly code generation (for example, a machine description file in GCC whose syntax follows a HDL syntax and semantics); and a HDL generator which generates the HDL code from a low-level IR code translated by the main compiler front-end and middle-end from the high-level language code immediately before a stage of generation of a target assembly code.

Preferably, the HDL code generated by the HLL-to-HDL translator from a function/subroutine in the high-level language code includes a datapath and a control unit, and the datapath and the control unit are implemented in Finite State Machine form.

Preferably, the HDL code of the function/subroutine in the high-level language code is generated into one or several block modules as the datapath and a top module as the control unit using a basic-block-by-basic-block generation method, or is generated into one module containing both the datapath and the control unit using a function-by-function generation method.

Preferably, in the basic-block-by-basic-block code generation method, the datapath includes one or several block modules, in which a block module is a set of FSM states generated from low-level IR instructions inside a basic block; in the function-by-function generation method, the datapath is a set of FSM states generated from the low-level IR instructions of all basic blocks inside the function/subroutine in the high-level language code, and the FSM state separation of the two methods is based on the delay estimation and data dependency of the low-level IR code instructions.

According to the present invention, the high-level language code to HDL code translation system and method can be applied for all high-level languages supported by the main compiler and can translate all syntaxes and semantics of a high-level language codes into HDL codes. In addition, the system and method is capable of utilizing all optimizations performed by the main compiler for high-level language codes by using a main compiler as a base compiler.

BRIEF DESCRIPTION OF THE DRAWINGS

The above and/or other aspects and advantages of the present invention will become apparent and more readily appreciated from the following description of the embodiments, taken in conjunction with the accompanying drawings of which:

FIG. 8 is a view showing an example of Verilog HDL code for a top module as a control unit generated using the basic-block-by-basic-block method according to an embodiment of the present invention;

FIG. 9 is a view showing an example of a top module in Verilog HDL code which contains a control unit and instances of the block modules generated using the basic-block-by-basic-block method according to an embodiment of the present invention;

FIG. 14 is a code example showing the mechanism to perform cross call between software code running in a main core and hardware code running in a dedicated hardware when the main core and the dedicated hardware are loosely coupled according to an embodiment of the present invention;

DETAILED DESCRIPTION OF THE PREFERRED EMBODIMENT

Hereinafter, preferred embodiments of the present invention will be described in detail with reference to the accompanying drawings.

Figure 1:
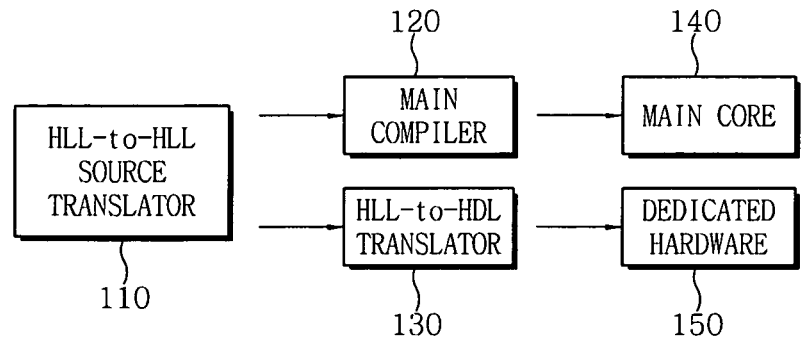
FIG. 1 is a structural view of a system for translating a high-level language code into a HDL code according to an embodiment of the present invention.

FIG. 1 is a structural view of a system for translating a high-level language code into a HDL code according to an embodiment of the present invention.

Referring to FIG. 1, a high-level language (HLL) code to HDL code translation system of the present invention includes a HLL-to-HLL source translator 110, a main compiler 120 such as GCC (GNU Compiler Collection), a HLL-to-HDL translator 130 which translates translation-targeted high-level language code into HDL code such as Verilog, a main core 140 such as ARM (Advanced RISC Machine), and a dedicated hardware 150 such as FPGA (Field Programmable Gate Array).

If a programming directive is marked on a high-level language code section to be translated to HDL code, the HLL-to-HLL source translator 110 reads the directive and partitions the translation-targeted high-level language code into a hardware code part and a software code part. Here, the hardware code part refers to one or a set of subroutines in particular or plural programs of the translation-targeted high-level language code, and the software code part contains the remaining parts of the translation-targeted high-level language code, and function calls to the hardware code part.

The main compiler 120 serves to compile both the software code part and the hardware code part together, which were partitioned by the HLL-to-HLL source translator 110, into an executable code.

The HLL-to-HDL translator 130 serves to translate the hardware code part, which was partitioned by the C-to-C source translator 110, into a HDL code.

The main core 140 and the dedicated hardware 150 serve to execute the executable code compiled by the main compiler 120 and the HDL code translated by the translator 130, respectively, in mutual cooperation.

Figure 2:
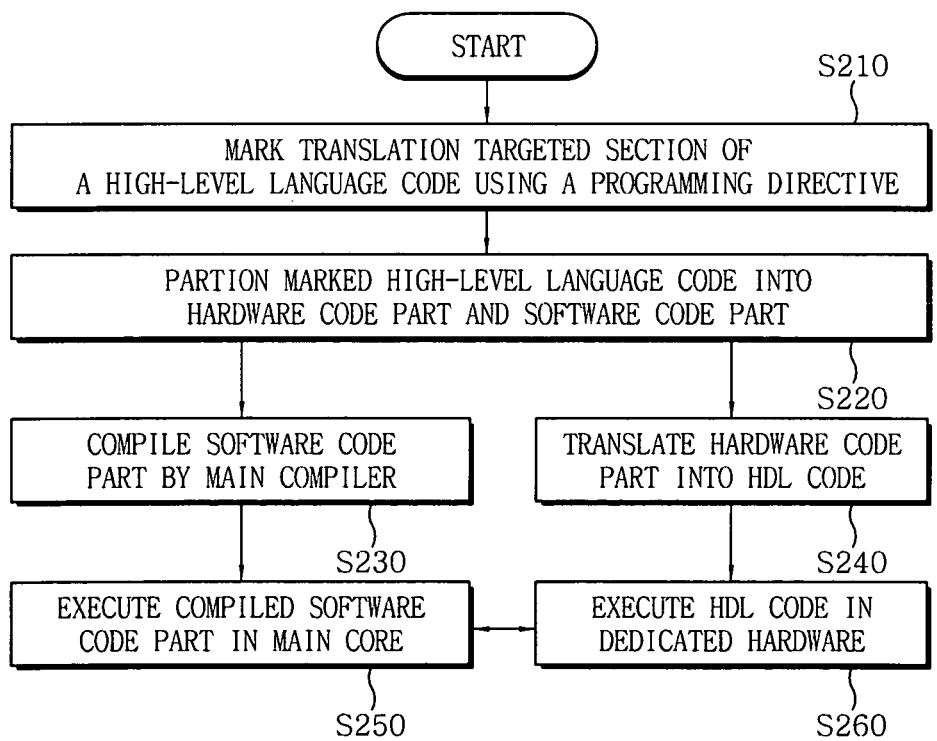
FIG. 2 is a flowchart showing a process of translating a high-level language code into a HDL code according to an embodiment of the present invention.

FIG. 2 is a flow chart showing a process of translating a high-level language code into a HDL code according to an embodiment of the present invention.

Referring to FIG. 2, a high-level language code to HDL code translation method of the present invention includes a step of marking a translation-targeted high-level language code using a programming directive (S210), a step of partitioning the marked code into a hardware code part and a software code part (S220), a step of compiling the software code part and the hardware part together using the main compiler (S230), a step of translating the hardware code part into a HDL code (S240), a step of executing only the compiled software code part in the main core (S250), and a step of executing the translated HDL code in the dedicated hardware (S260). Here, the main core and the dedicated hardware work in mutual cooperation.

Figure 3:
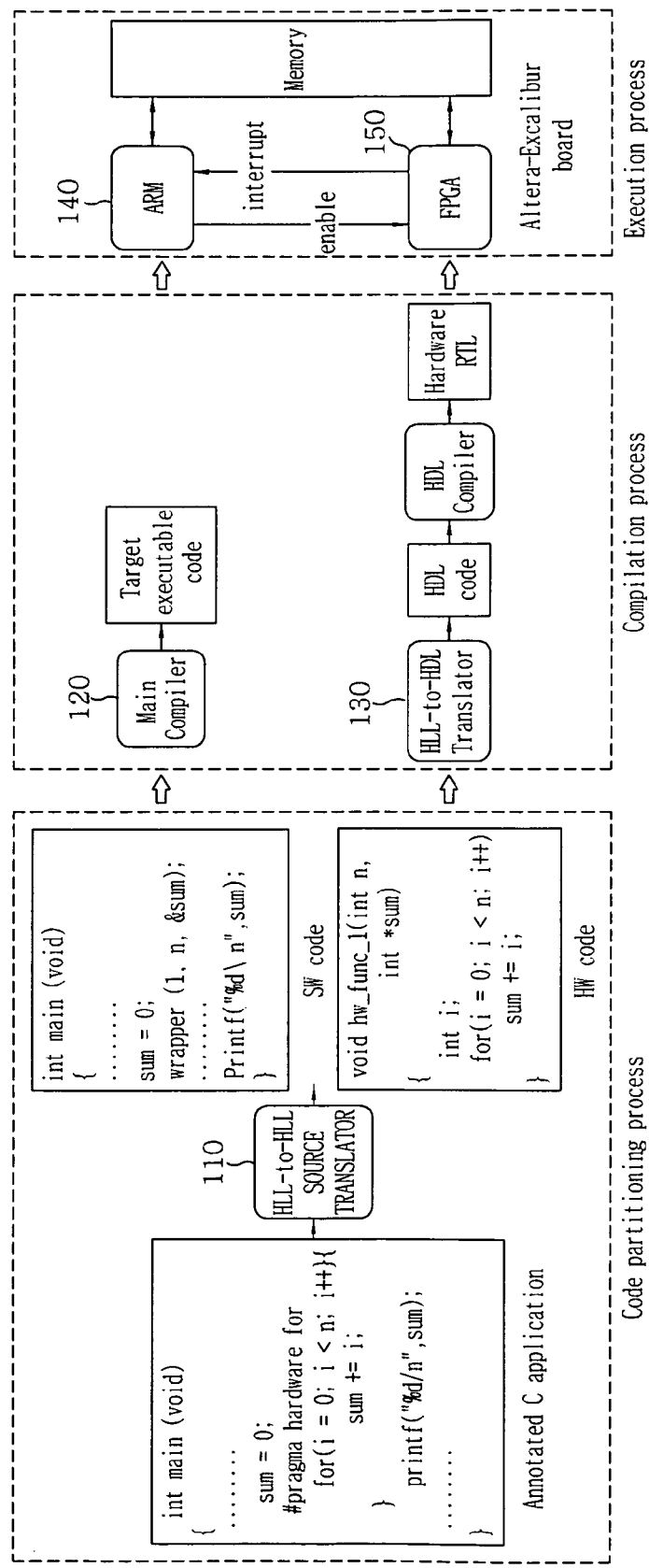
FIG. 3 is a view showing a prototype system configuration in case where the language to be translated is C language, according to an embodiment of the present invention.
Figure 4:
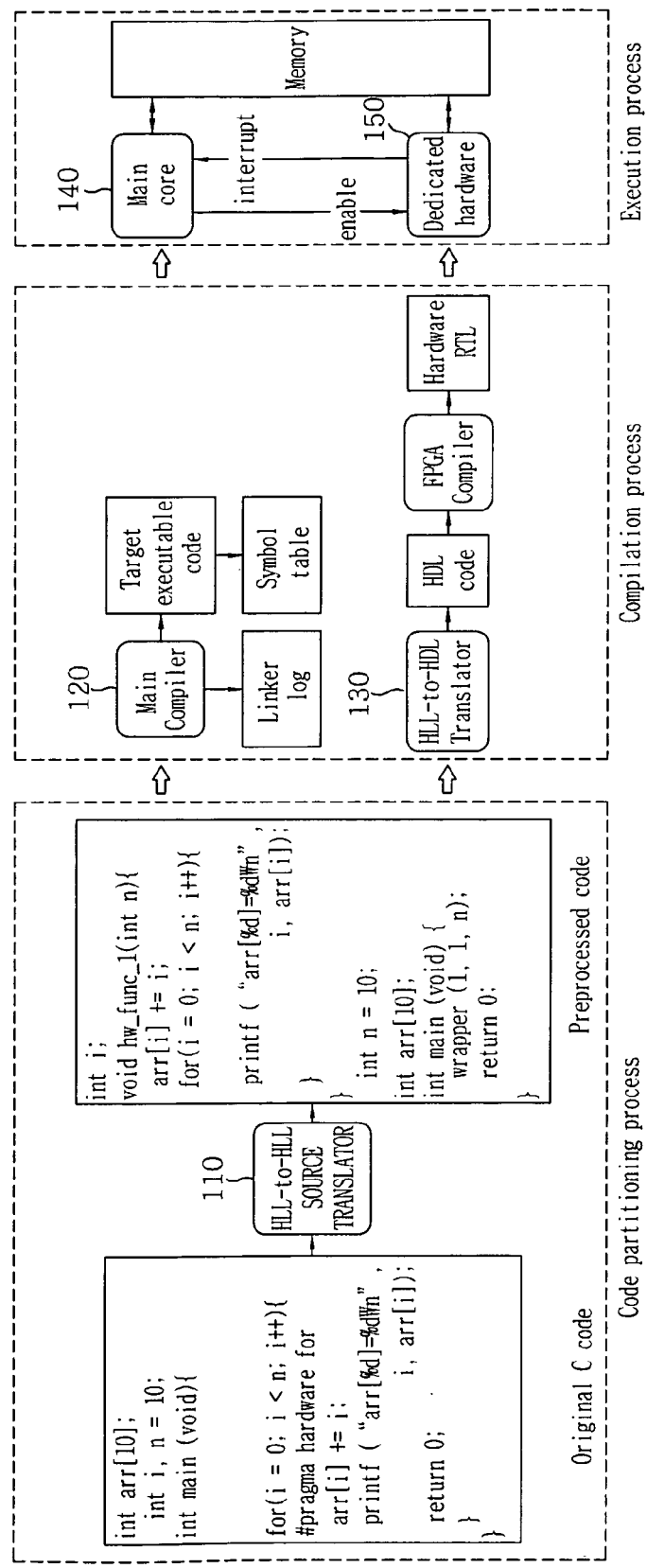
FIG. 4 is a view showing a prototype system configuration in case where the language to be translated is C language, according to another embodiment of the present invention.

FIG. 3 and FIG. 4 are views showing a prototype system configuration in case where the language to be translated is C language, according to another embodiment of the present invention.

Referring to FIG. 3 and FIG. 4, in the code preprocessing process, a programmer annotates C code sections to be translated into Verilog of a translation-targeted code by using programming directives like pragma, where the annotated code can be a loop (#pragma hardware for in the figure), a subroutine (#pragma hardware function) or any section of code (#pragma hardware section). Then the HLL-to-HLL source translator 110 reads the marked code and translates the annotated code sections into subroutines. The remaining code sections besides the annotated code sections are the software code part. Both the hardware code part and the software code part are stored within a common file or can be stored in separate files. The generated hardware functions are named with a prefix hw_func_ and a hardware identification number hwid (see hw_func_1 in FIG. 4). The extracted code section is replaced with a call to an API function, called wrapper. A unique hardware identification number hwid is assigned to each hardware function, since the hardware does not have an address like the software, then the hwid is used to identify the generated hardware functions.

After the code preprocessing is performed, both the software and hardware codes are compiled together by a main compiler 120 such as the GCC compiler to generate an executable code, the hardware function is translated by the HLL-to-HDL translator 130 into the corresponding synthesizable Verilog code.

Suppose that global variables and functions are declared in the software side (arr[10] and printf), but they are accessed by the hardware (hw_func_1). If the software and the hardware codes are not built together, the hardware cannot know the addresses of the global symbols. The symbol table contains addresses of all global variables and functions as well as base addresses of data sections. Therefore, after the software compilation compiles both the software and the hardware codes together, the hardware compilation uses the table for the address resolution of global symbols.

However, a constant string like "arr[%d]=%d" in the hardware code is not a variable to be contained in the symbol table; it is stored in a .rodata section. The address of the constant is calculated as the sum of three variables: the start address of .rodata section from the symbol table, the constant's offset address from input source files to be processed by the HLL-to-HDL translator, and the file offset address from a modified GCC linker according to the present invention.

The GCC compiler compiles both the software and the hardware codes together. Because the software function will be accessed by the hardware and not by the software, it can be excluded for code optimization in the software compilation, i.e. deadcode elimination. For example, the library function printf needs to be included in software for the call from the hw_func_1 function. The hardware compilation also compiles the whole source code in order to correctly calculate the constant offset information. However, only hardware functions are translated into Verilog code, and other code sections are ignored by the HLL-to-HDL translator.

The generated Verilog code is synthesized by an FPGA hardware compiler and run on a dedicated hardware such as FPGA 150, while the SW executable code is run on the main core 140 such as the ARM processor.

Figure 5:
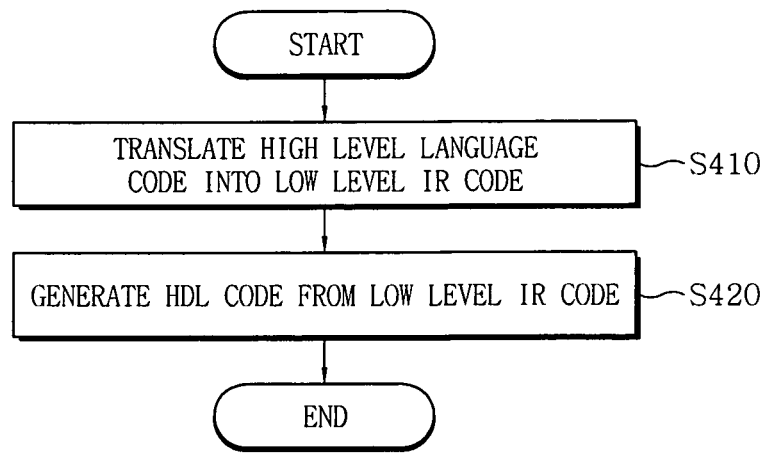
FIG. 5 is a flowchart showing a process of translating a hardware code part into a HDL code by means of a HLL-to-HDL translator according to an embodiment of the present invention.

FIG. 5 is a flowchart showing a process of translating a hardware code part into a HDL code by means of a HLL-to-HDL translator according to an embodiment of the present invention.

Referring to FIG. 5, a process of translating a high-level language hardware code part into a HDL code such as Verilog may include a step of translating the high-level language code into a low-level IR (Intermediate Representation) such as the RTL (Register Transfer Language) IR of GCC compiler code (S410), and a step of generating a HDL code such as Verilog from the low-level IR such as RTL immediately before a step of generating a targeted assembly code (S420).

The steps S410 and S420 are performed by the HLL-to-HDL translator which contains the front-end and middle-end of a main compiler such as GCC and a HDL back-end.

The step of translating the hardware code part into the low-level IR code such as RTL (S410) is to translate the high-level language code into low-level IR of GCC such as the RTL code by means of the main compiler's front-end and middle-end inside the HLL-to-HDL translator, and the step of generating a HDL code such as Verilog from the low-level IR such as the RTL code is to translate the low-level IR into a HDL code by means of the HDL back-end of the HLL-to-HDL translator of the present invention. Here, the HLL-to-HDL translator uses the low-level IR immediately before the low-level IR is used to generate a target assembly code in other backends to generate HDL codes. That is, the HLL-to-HDL translator can be extended to translate any input language supported by the main compiler into HDL code, since the RTL code is independent of input HLLs.

Hereinafter, the method of generating a HDL code such as Verilog from the low-level IR such as RTL is described in more detail.

Assuming that the GCC compiler is used as the main compiler and the translated HDL is Verilog language. The middle-end part of the GCC compiler uses an intermediate representation called RTL to perform optimization processes before converting it to an assembler language. GCC's RTL is the abstract description of a program which is parameterized by a machine description file. The machine description file (*.md) in GCC defines the target processor specification such as functional units, register files as well as the instruction set architecture. According to the present invention, a Verilog backend is created to facilitate the RTL to Verilog code translation whose instruction patterns follow the Verilog syntax.

When carefully investigating RTL basic block codes, a lot of similarities can be seen between the RTL and Verilog languages. In RTL, all memory accesses to C pointers and complex data structures are converted into simple memory accesses, and all kinds of control statements are translated into branches and jump instructions. The RTL follows three-address codes, which can be easily converted into Verilog statements. All operators in RTL can be also expressed by those in Verilog, and live-in and live-out registers of RTL basic blocks can be converted into input/output data types of Verilog modules. The block modules communicate with each other through the input/output data. The use of registers in RTL can be matched to reg data variables in the Verilog language.

The problem of absent timing control and concurrency in software RTL is solved by introducing a Finite State Machine (FSM), which preserves the software execution sequence while exploiting concurrent execution (i.e., operational parallelism) in hardware. Each state is numbered uniquely like program addresses, and one state represents an execution within one clock cycle. Within one FSM state, one or several RTL instructions can be executed; or a time-consuming RTL instruction is executed in several FSM states. If several instructions are independent, they can be executed in parallel within one state. The more instructions can be executed in parallel the faster execution will be. However, since some instructions like a function call, a division, and a memory access take longer than one state, the Verilog backend generates code to execute them in several FSM states according to the present invention. After executing all instructions in the current state, the state variable (like PC, program counter, in a processor) is set to the next state number. A non-blocking assignment (<=) is used in the generated code.

In general, a hardware system, excluding I/O peripherals and memory systems, consists of two parts: a datapath (registers, functional units) and a control unit to control the datapath. Similarly, a hardware subroutine is translated into one datapath and one control unit by the HLL-to-HDL translator. The datapath is implemented as one or several Verilog block modules, and the control unit is implemented as one Verilog control module. One Verilog block module is constructed from one RTL basic block.

Figure 6:
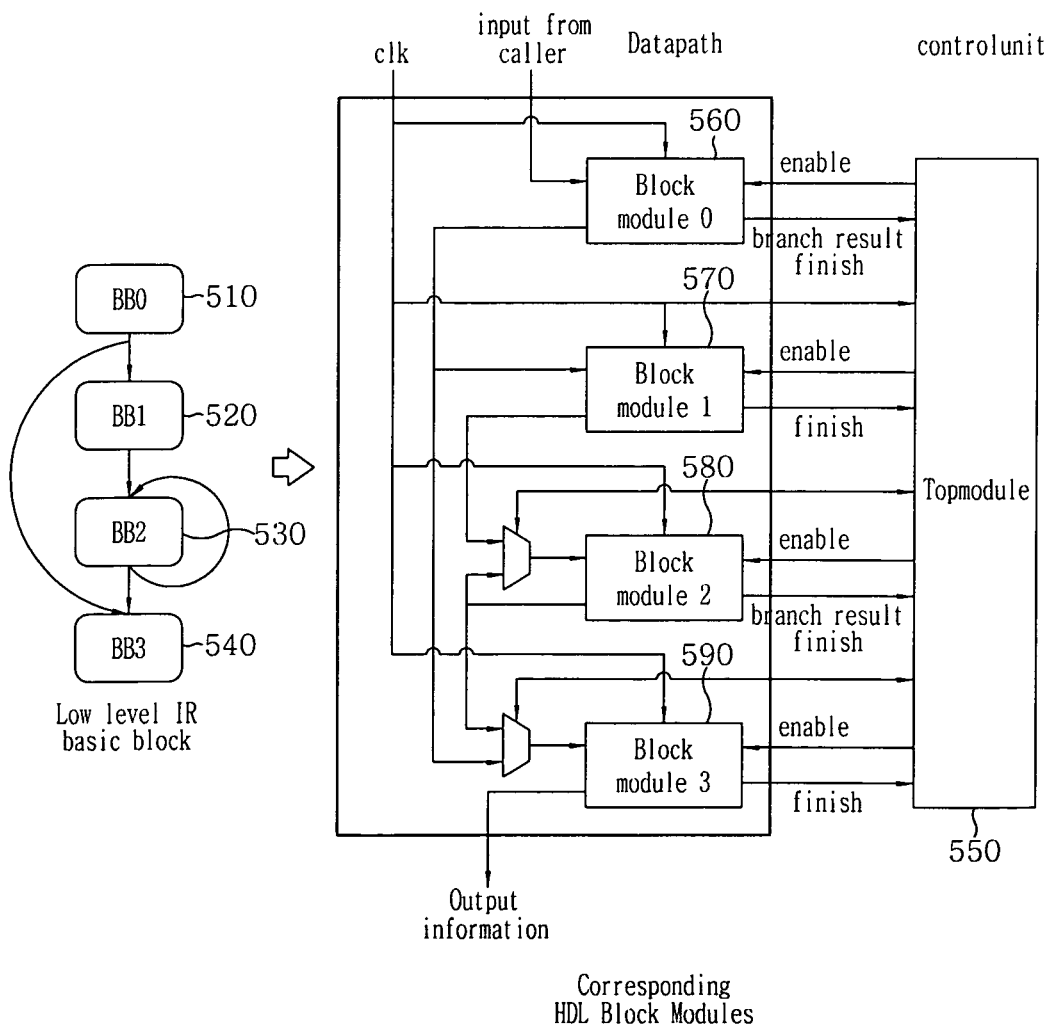
FIG. 6 is a block diagram showing the control flow and communication among the HDL block modules as the datapath and the top module as the control unit generated from a HLL subroutine using the basic-block-by-basic-block method according to an embodiment of the present invention.

FIG. 6 is a block diagram showing the control flow and communication among the HDL block modules as the datapath and the top module as the control unit generated using the basic-block-by-basic-block method according to an embodiment of the present invention. Referring to FIG. 6, in GCC, RTL codes of a function are divided into several basic blocks 510 to 540, each of which has only one entry point and only one exit point. Accordingly, a control flow instruction is decided at the end of a basic block. That is, a currently executed basic block or a predecessor identifies the next basic block or a successor which should be executed after it. The input or output information between the predecessor and the successor is a register file. In this case, the successor will use registers updated by the predecessor for its execution.

Referring to FIG. 6, the HDL modules of the present invention may include two kinds of modules, i.e., block modules 560 to 590 as a datapath and a top module 550 as a control unit to control and schedule the execution of the block modules 560 to 590. A block module is created and utilized to perform the task of a basic block of the low-level IR code with a resister set. The register file in the low-level IR code is implemented as input and output signals of the block modules. The top module 550 controls execution between plural different block modules. Specifically, the top module 550 assigns inputs to the block modules and enables one block module at a time. When enabled, a block module executes its code with assigned inputs, buffers its output in its own register set, and returns that output buffered in the register set as well as control flow outcome to the top module 550. Then, the top module 550 decides which block module should be executed next based on the control flow outcome. Using such a mechanism, the datapath by the block modules can be separated from the control path by the top module.

For example, a block module containing a branch instruction such as block module 0 or block module 2 in FIG. 6 sends its branch result (for example, the result of a comparison instruction) to the control module in order to determine the next block module. The control module enables the next block module through an enable bb signal and helps the block module to select correct input data from its predecessor through an input select signal.

Body codes of each of the block modules are generated by the machine description file of the present invention directly from the low-level IR code such as RTL. On the other hand, body codes of the top module are generated by a HDL code generator of the present invention based on information of the basic blocks of the low-level IR code. The output of the HLL-to-HDL translator of the present invention contains several block modules and one top module.

Figure 7:
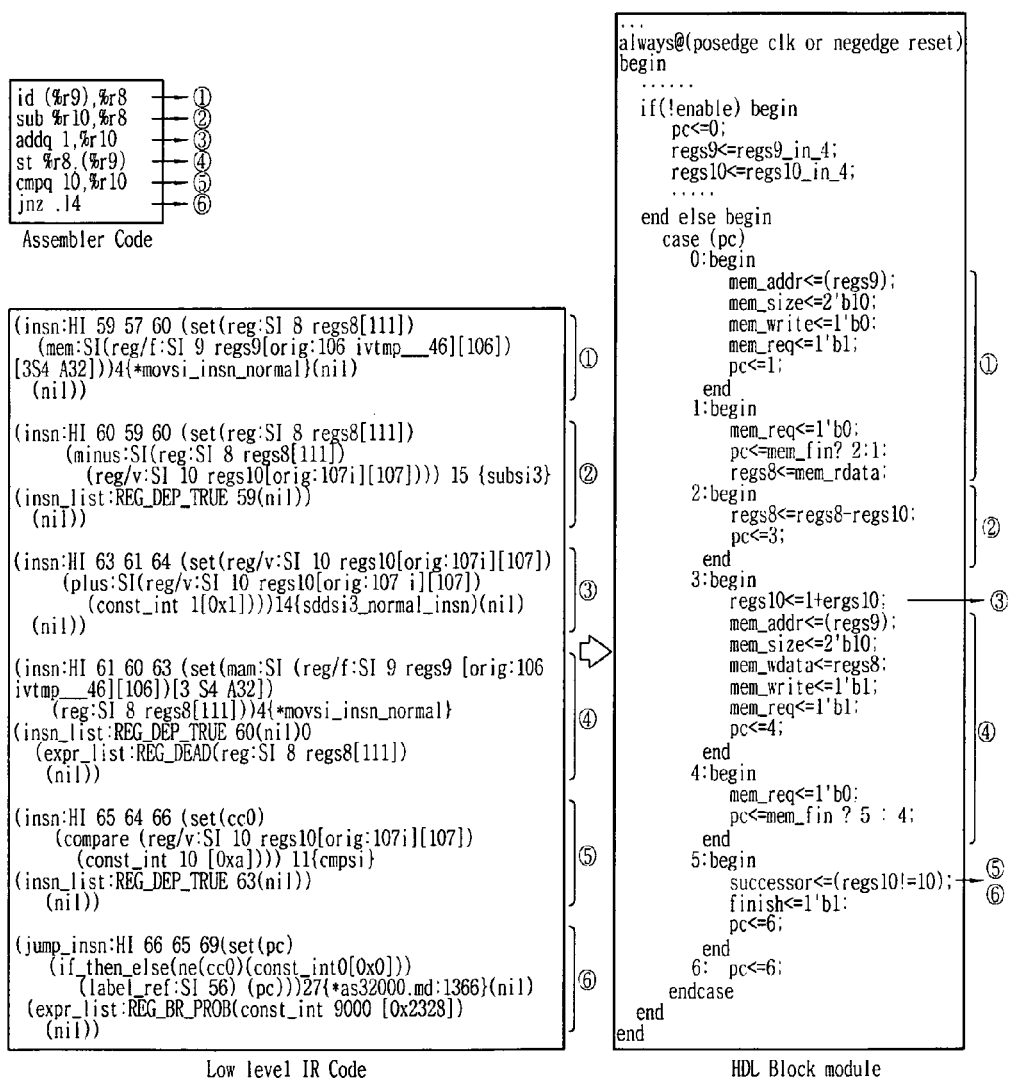
FIG. 7 is a block diagram showing the code generation of a block module in Verilog HDL code from a basic block in low-level RTL representation of GCC compiler using basic-block-by-basic-block code generation method according to an embodiment of the present invention.

FIG. 7 is a block diagram showing the Verilog code generation of a block module from a basic block of a low-level IR code using the basic-block-by-basic-block code generation method according to an embodiment of the present invention. The circled numbers ① to ⑥ are used to represent one-to-one matches between an assembly code, RTL instruction, and its equivalent Verilog code. The FSM states are numbered, and they are shown in case statements.

Referring to FIG. 7, instructions numbered from ① to ⑥ of a low-level IR code are respectively translated into assembler instructions numbered from ① to ⑥ of the corresponding assembler code, or they can be translated into corresponding HDL codes which are numbered from ① to ⑥ of the HDL block module.

Hereinafter, the generation of HDL code such as Verilog code for a block module using the basic-block-by-basic-block method of the present invention will be described.

Every block module or top module is generated in the form of a Finite State Machine (FSM) using a Verilog combination "always" block. Referring to FIG. 7, the instruction sequence is divided into several parts, each of which corresponds to a stage of the FSM. After finishing the execution of all instructions in the current stage, a stage variable is set to the next coming stage number.

Each FSM stage is executed within one clock cycle, so a FSM stage can execute one or several low-level IR instructions. The more instruction which can be executed within one FSM stage, the faster the performance of a dedicated hardware such as FPGA. The condition of instructions that can be executed within one stage is that: the instructions are parallel, i.e., independent of each other. The HLL-to-HDL translator of the present invention decides how to break the low-level IR instruction sequence into stages based on delay estimation and data dependency of instructions. It is considered that the addition, subtraction, assignment, shift and logic operation are not time consuming operations and can be executed within one cycle. Several non-time consuming operations can be included in one FSM if only they are parallel. However, the multiplication, division and memory access are time consuming operations, so instructions which depend on these operations have to wait for completion of these operations and are then executed in the next cycles.

For example, when the HDL block module in FIG. 7 is enabled (enable at the top of the code), the state variable, pc, is set to state 0 and registers regs9 and regs10 are initialized with live-in values (* in 4) from its predecessor module. At the next cycle, state 0 is executed. The variable pc indicates the state to be executed at the next cycle, and it is similar to a program counter in a processor.

The memory load instruction is executed in two states, state 0 to request the memory service, and state 1 to check the memory status and to receive data from the memory.

The third instruction, an addition, can be executed concurrently with the fourth one, a memory store, in state 3, because they are independent. The store execution is also broken into two states: state 3 for memory initialization, and state 4 for checking the memory status.

At the end (state 5), the branch outcome (successor) signal is determined by a value of regs10, and the finish signal is set to notify the control module that the execution of this block module is finished.

Next, HDL code generation for the top module using the basic-block-by-basic-block method will be described.

FIG. 8 is a view showing an example of a FSM form of a top module in Verilog code generated using the basic-block-by-basic-block method according to an embodiment of the present invention.

A top module is generated by the HLL-to-HDL translator as a control unit to control and schedule the block modules. The top module also uses an FSM with uniquely numbered states. It uses an enable bb signal to enable/disable block modules. A block module is enabled if the bit position corresponding with its HWID (hardware identification number) is set. For example, (enable_bb<=4'b0001) means that there are four block modules to be controlled and block module 0 is enabled. When a block module is enabled, it executes its code body using the incoming inputs from its predecessor block module, and then buffers outputs, which will be the inputs of its successors, in its own register set. If a block module ends with a conditional branch, it returns its branch outcome to the top module through a successor signal at the end of the execution. The top module decides a successor block module by considering that branch outcome.

FIG. 9 is a view showing an example of the top module which contains a control unit and instances of the block module according to an embodiment of the present invention.

Two main tasks of the top module are to assign input/output to block modules and to schedule their execution. In order to assign input/output signals, the top module creates instances of block modules. This is because the block modules cannot be directly defined and used but can be just defined in a structural/functional fashion and instantiation is required to use the defined block modules. The top module assigns outputs of a currently executed block module as an input of a block module to be executed next. The predecessor/successor relationship among block modules is the same as in RTL basic blocks.

Hereinafter, the Verilog code generation for a HLL subroutine using the function-by-function method of the present invention will be described.

Figure 10:
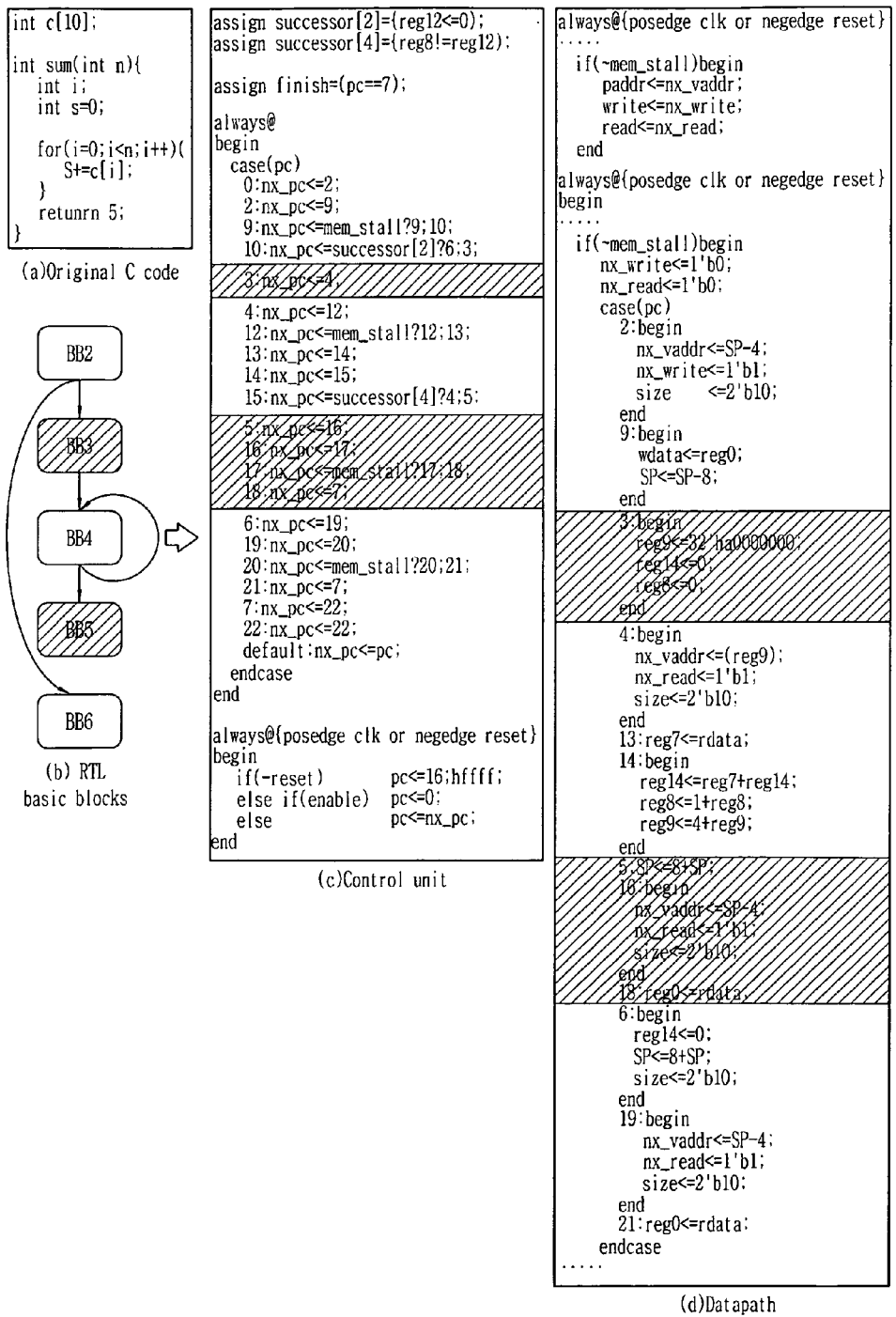
FIG. 10 is a block diagram showing the datapath and the control unit of a C function generated using the function-by-function code generation method according to an embodiment of the present invention.

FIG. 10 is a block diagram showing the datapath and the control unit of a C function generated using the function-by-function code generation method according to an embodiment of the present invention.

Using the basic-block-by-basic-block code generation which translates each basic block into a HDL block module as described in FIGS. 6, 7 and 8, the generated HDL code can easily be controlled and debugged. However, the generated HDL code will consume a lot of resource, since a separate register file for each block module needs to be implemented. If the number of basic block in a hardware function is large, the HDL code will use a huge number of registers and make the FPGA resource exhausted.

In order to save resource, HDL code can be generated function-by-function in which the whole low-level IR code of a HLL function is translated into a general datapath. So the whole HLL function uses only one global register file. The C code and RTL control flow graph are shown in FIG. 10 (a) and (b); the translated Verilog code including a control unit and a datapath are shown in FIG. 10 (c) and (d), respectively.

Referring to FIG. 10 (c) and (d), the datapath and the control unit construct one FSM. The control unit changes the value of the state variable (nx_pc) of the FSM, and the datapath contains register files and functional units to generate the outputs of the FSM.

The HLL-to-HDL translator translates one basic block into block of FSM states, and the states of all basic blocks are combined to form the global datapath. Since a low-level IR basic block has only one entry point and one exit point, a block state also has one entry state and one exit state. The entry state of a state block is numbered with the corresponding low-level IR basic block number. This numbering method makes the changing control flow among block states very convenient. For example, if the control unit wants to jump to the entry code of basic block 3, it can immediately know that the state it should jump to is 3. So if the biggest basic block number of a function is n, then the first n numbers is reserved to number entry states of block states. And the number n+1 is reserved for the exit state of the function. The numbers from n30 2 are used for states inside basic blocks, or inner states. The datapath pushes link and callee-saved registers to the stack at the starting point, and pops them at the end like the normal software execution. Even if each hardware function has a separate register file, the pushing and popping registers are still necessary in order to support recursive functions.

A detail implementation of the datapath is shown in FIG. 10 (d). The RTL code of the hardware function contains five basic blocks numbered from 2 to 6. The link register (reg0) is pushed into stack at state 2 and restored at state 16 of block 5 and state 19 of block 6 since the function has two exist points. Since the C function is not register intensive, the compiler can use only caller-saved registers (reg7<=reg14) for the execution so there no need to save other callee-saved registers except the link register.

The based address of the global array c is assigned to reg9 at state 3, and the loop body calculation is done in state 4, 12, 13, 14, 15 of basic block 4. The array element c[i] is assigned to reg7 from the memory at stage 4, 12 and 13. The array elements are accumulated to reg14 at stage 14 (reg14<=reg7+reg14). The loop threshold n is kept in the first argument register reg12, so the loop's induction variable i kept in reg8 is compared with reg12 (successor[4] =(reg8!=reg12);) to decide the branch decision at the stage 15 in the control unit.

Referring to FIG. 10 (c), the generated control unit includes two always blocks: one for the sequential state variable (pc) and one for the combinational next state (nx_pc). Almost every low-level IR instruction is executed within the datapath except the comparison and jump instructions. A jump instruction changes the control flow among basic blocks which means changing the state variable (pc) value. So it is implemented in the control unit instead of the datapath. A comparison operation is used to set the condition to perform a jump instruction by generating control signal for the control unit so it is also excluded from the datapath. The result of a comparison operation is checked using a continuous assignment, so that the delay of performing the operations can be minimized.

For example, at the end of basic block 2 the comparison checking whether the value of register 12 (reg12) is greater than zero is implemented as statement (assign successor[2]= (reg12<=0)) in FIG. 10 (c). When the control flow reaches the end of basic block 2, the value of successor[2] will be correctly set; it is then used by the control unit to execute a jump instruction to change the execution state. The basic block 2 has two successors: basic block 3 and 6. If the branch is taken, successor[2] signal is set, the control is changed to the basic block 6, or otherwise the basic block 3 is chosen for the next execution, (10: nx_pc<=successor[2] ? 6: 3;).

At the end of the function, the control flow goes to an exit state, state 7 in FIG. 10 (c), and a finish signal is set with an continuous assignment (assign finish=(pc==7)) to announce the exit status of the executing function. This exit state is equal to an exit basic block in RTL. After that state variable is changed to a stall status at state 22 (22: nx_pc<=22;).

Next, information exchange between a main core such as ARM, which is an embedded microprocessor, and a dedicated hardware such as FPGA will be described.

Figure 11:
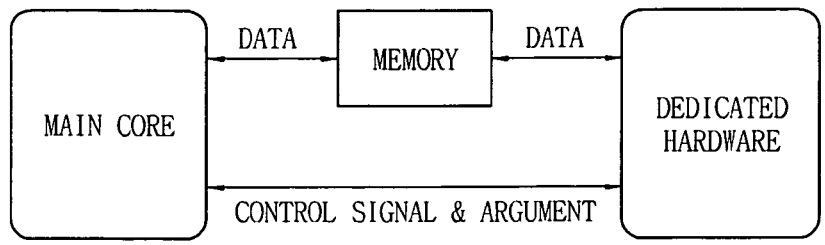
FIG. 11 is a block diagram showing communication interface between a main core and a dedicated hardware according to an embodiment of the present invention.

FIG. 11 is a block diagram showing the communication interface between the main processor and the dedicated hardware according to an embodiment of the present invention.

Referring to FIG. 11, the main processor and the dedicated hardware exchange information via a memory and control signals such as enable signal and arguments.

Hereinafter, the calling convention between the main core and the dedicated hardware when they are loosely coupled will be described in detail.

Figure 12:
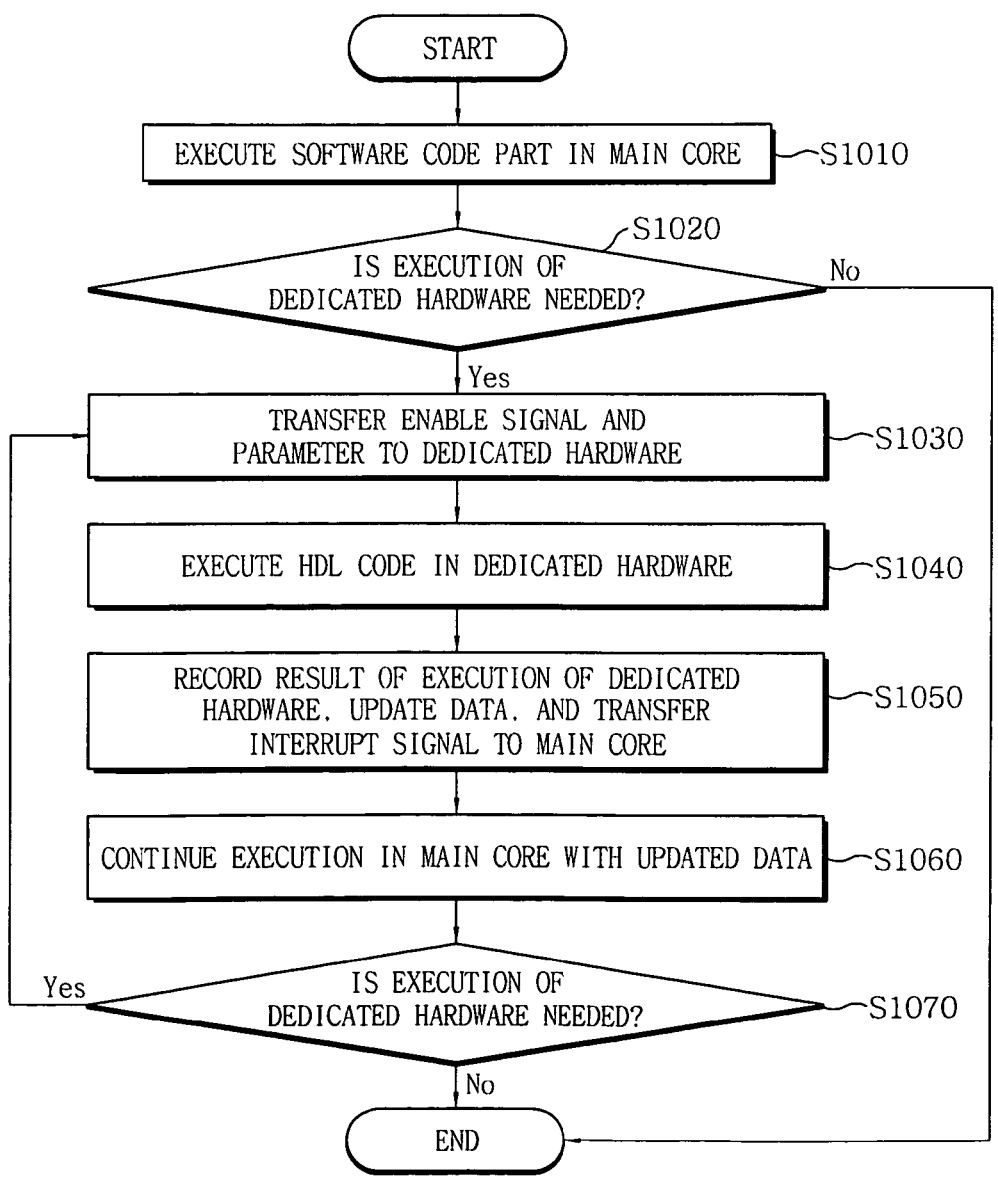
FIG. 12 is a flow chart showing a calling procedure of a software code part in a main core and a hardware code part in a dedicated hardware according to an embodiment of the present invention.

FIG. 12 is a flowchart showing a calling procedure of a software code part in a main core such as ARM and a hardware code part in a dedicated hardware such as FPGA according to an embodiment of the present invention. Referring to FIG. 12, at the starting point, the compiled software code part in the main core is executed (S1010). Next, it determines whether to execute any hardware intellectual property (HWIP) in the dedicated hardware (S1020) or not. If the execution of the dedicated hardware is needed, the main core calls the dedicated hardware (S1030). Next, the dedicated hardware executes the called HWIP. (S1040). Next, the dedicated hardware informs the main core of the completion of the execution (S1050). Finally, upon receiving the execution completion signal from the dedicated hardware, the main core continues to execute the software code part with the updated data (S1060). If there is no need of further execution of any HWIP in the dedicated hardware, the program is terminated.

Figure 13:
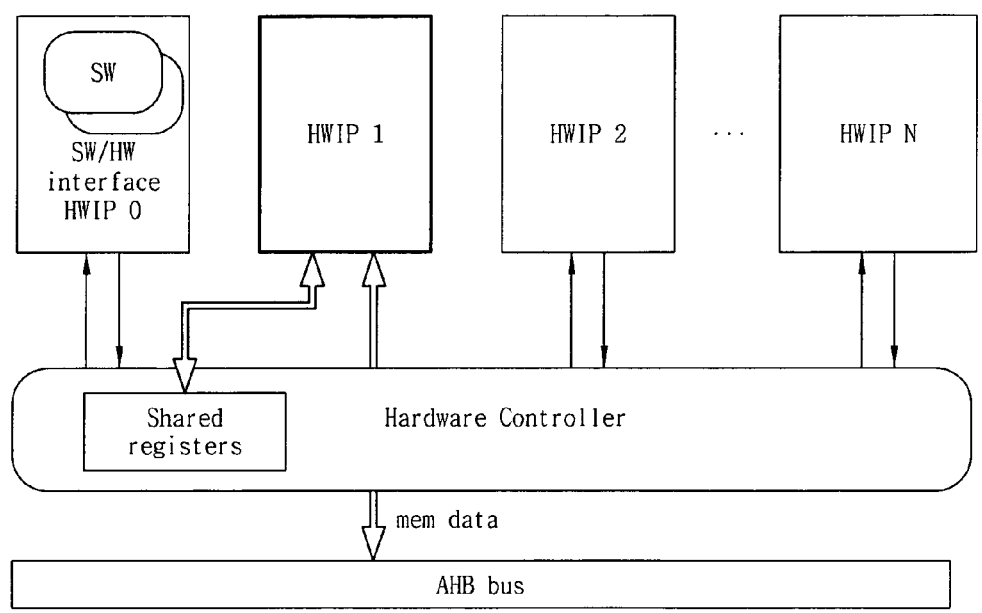
FIG. 13 is a block diagram showing a SW/HW interface and a HW controller for the support of cross call between software and hardware in case the main core and the dedicated hardware are loosely coupled according to an embodiment of the present invention.

FIG. 13 is a block diagram showing a SW/HW (software/hardware) interface and a hardware controller for the support of cross call between software and hardware in case the main core and the dedicated hardware are loosely coupled according to an embodiment of the present invention.

In order to support cross calls between SW(software) and HW(hardware) in case the main core and the dedicated hardware are loosely coupled, two additional HW components are added: a SW/HW interface and a HW controller as shown in FIG. 13. The SW/HW interface module implemented in the dedicated hardware is used to wrap the SW, i.e., the main core, so that a uniform interface is provided to HW functions at cross calls. This module hides all communication details from HW to SW calls, and makes HW control modules communicate with SW in the same way as other HW components do. The SW/HW interface's hwid (hardware identification number) is numbered 0 by default as shown in FIG. 13.

The HW controller was implemented in the dedicated hardware to control and schedule the SW/HW interface and HW components. For this purpose, the controller contains a set of shared registers among HW modules; the registers include four argument registers, the HW stack pointer and the link register. The HW controller activates one HWIP at a time; once activated (HW module 1 in FIG. 13), the active HWIP has the right to access all system resources while other modules are blocked.

FIG. 14 is a code example showing the mechanism to perform cross call between software code running in a main core and hardware code running in a dedicated hardware in case the main core and the dedicated hardware are loosely coupled according to an embodiment of the present invention.

Referring to FIG. 14, the original C code shows the programming directive annotated code of a user. The user wants to execute the min function and a for-loop in the main function in hardware. The C-to-C source translator creates two hardware subroutines from the annotated code sections: hw_func_1 for the loop and hw_func_2 for the min function, as shown in the preprocessed code of FIG. 14. The for-loop in main of the original code is replaced with a call to an API wrapper function to perform the communication with the dedicated hardware.

Figure 15:
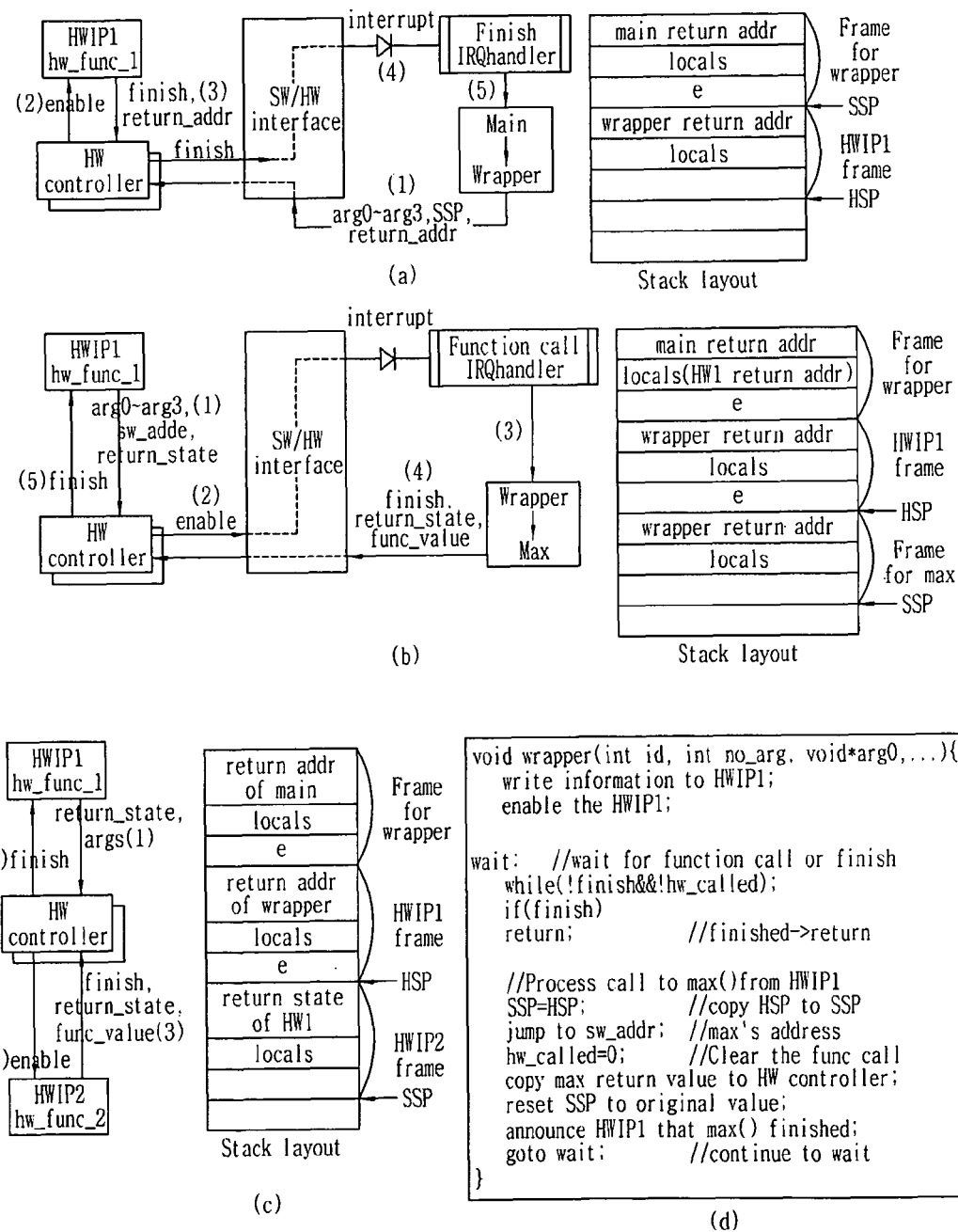
FIG. 15 is a block diagram showing the cross call implementation of the example code in FIG. 14 between a main core and a dedicated hardware when they are loosely coupled according to an embodiment of the present invention.

FIG. 15 is a block diagram showing the cross call implementation of the example code in FIG. 14 between a main core such as ARM and a dedicated hardware such as the FPGA in case the main core and the dedicated hardware are loosely coupled according to an embodiment of the present invention.

When the main core and the dedicated hardware are loosely coupled, the dedicated hardware uses a separate system registers from the main core, and it communicates with the main core through interrupting. Also the main core uses an API called wrapper to perform the communication steps.

Referring to FIG. 15, the FIG. 15 (a) shows the execution flow when the software API wrapper in main calls the HWIP1 (hardware intellectual property 1) (hw_func_1), and the execution steps are numbered from (1) to (5).

(1) The wrapper functions stores the first 4 arguments (a, b, c and d) of HWIP1 into argument registers, the last arguments (e) into its stack, copies the value of stack pointer into the hardware stack pointer register, and stores a return address into a link register inside the HW controller of the dedicated hardware through the SW/HW interface. Then the wrapper sends an enable signal with (hwid=1) to the controller for the HWIP1 execution.

(2) The HW controller enables the HWIP1 module. At the beginning of its execution, HWIP1 reads stack pointer values inside the hardware controller and allocates its stack space. HWIP1 stores its return address from the link register of hardware controller into its own stack, and starts to execute its body.

(3) When HWIP1 finishes, it restores the stack space and sends a finish signal to the HW controller with the return address.

(4) The HW controller sends an interrupt signal to the ARM processor for enabling the wrapper function through the SW/HW interface.

(5) An interrupt handler sets a global variable finish in SW in order to notify the end of execution of HW1 to the wrapper. The wrapper function then finishes.

FIG. 15 (d) shows a pseudo code of the wrapper function. After calling a HW function, the wrapper waits for two events. One is that the HW callee finishes (SW calls HW). The other is that the HW callee calls other SW functions (SW calls HW, then HW calls SW). If HW returns to SW, the wrapper finishes. If HW calls other SW function, the wrapper serves the call.

The method to call SW from HW is similar. Consider the scenario that hw_func_1 calls max function in FIG. 14. The execution sequence is shown in FIG. 15 (b), and the order is as follows:

(1) HWIP1 stores max's first four arguments (a, b, c and d) into argument registers inside the HW controller, and the last argument (e) on the bottom of its own stack. Also, HWIP1 stores its return state into a link register inside the HW controller. Then it sends max's real address in a sw_addr signal with hwid=0 for a callee with an enable signal to the HW controller.

(2) The HW controller disables the HWIP1 module, and interrupts the processor through the SW/HW interface in order to call the max function.

(3) The interrupt handler notifies the wrapper about the call through global variables, hw called in FIG. 15 (d). The wrapper updates the main core stack pointer; updates argument registers with values in HW controller, stores the HW1 return state in its local stack, and calls the max function.

(4) When max finishes, wrapper sends a finish signal as well as max's return value to the HW controller and restores a return state through the SW/HW interface.

(5) The HW controller enables HW1 by providing the return state from the link register.

FIG. 15 (c) shows the scenario that hw_func_1 (HWIP1) in FIG. 14 calls hw_func_2 (HWIP2).

The calling process of the two HWIPs is as following:

(1) HWIP1 stores arguments in argument registers of the HW controller and the stack, and a return state into a link register inside the HW controller. After that, HWIP1 sends a call signal with a target function hwid=2 to the HW controller.

(2) The HW controller enables HWIP2, and HWIP2 stores HWIP1 return state in its own stack.

(3) When HWIP2 finishes, it sends a finish signal together with caller's return state to the HW controller.

(4) The controller enables HWIP1 again, and HWIP1 continues to execute from its original state.

Hereinafter, the calling convention between the main core and the dedicated hardware when they are tightly coupled will be described in detail.

Figure 16:
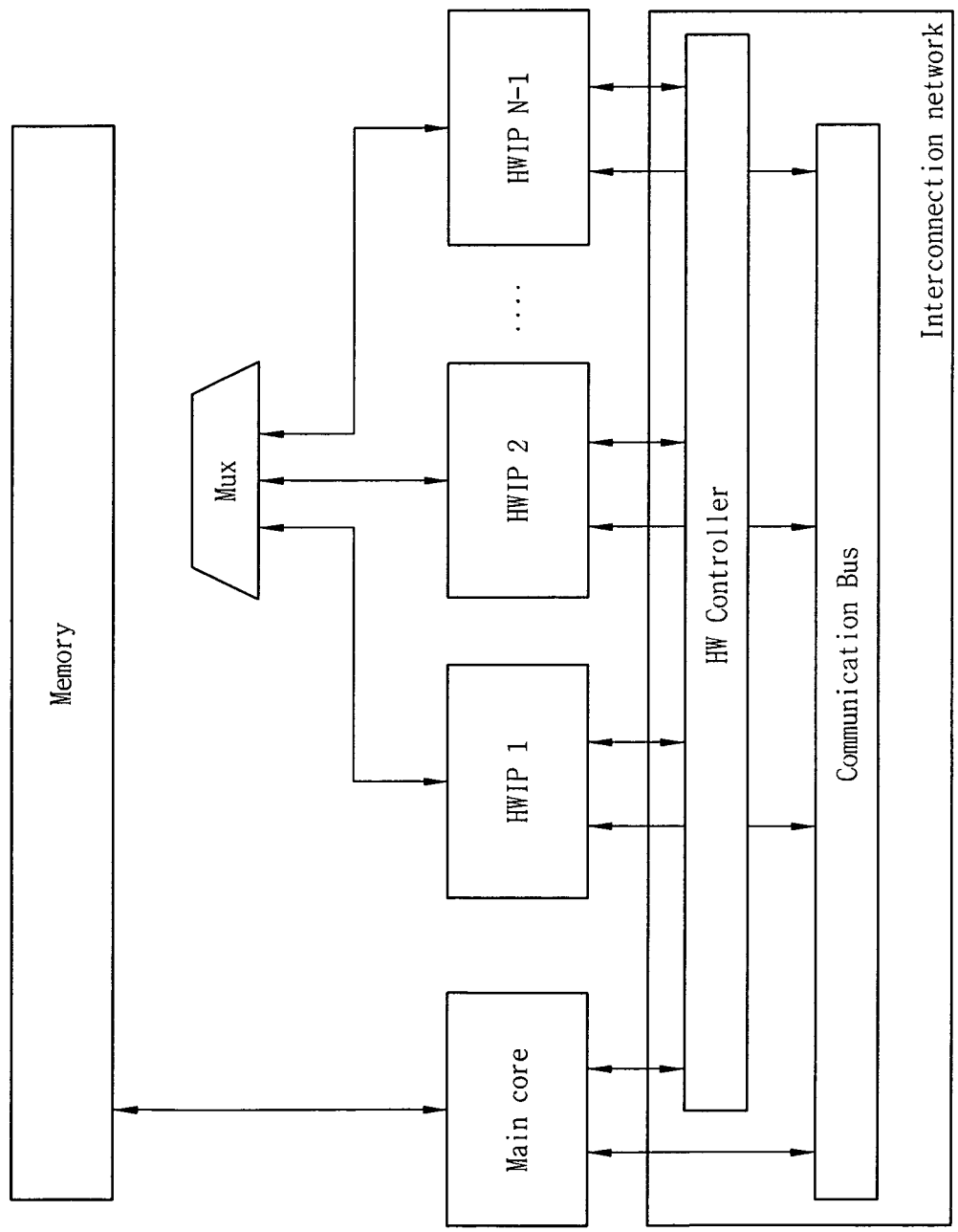
FIG. 16 is a block diagram showing the communication interface between a main core and a dedicated hardware when the main core and the dedicated hardware are tightly coupled, according to an embodiment of the present invention.

FIG. 16 is a block diagram showing the communication interface between a main core and a dedicated hardware when the core and the dedicated hardware are tightly coupled, according to an embodiment of the present invention.

Referring to FIG. 16, the communication between the main core and the HWIPs of the dedicated hardware is done through an interconnection network. The interconnection network includes a bus system and a controller to control the bus and the execution of HWIPs and the main core. Every HWIP and the main core make a part of their register file readable to other components through the bus. The public registers include: stack pointer, link register, argument registers and function return registers. So there is no need of a separate set of system registers inside the controller.

Since the main core and HWIPs are not connected by an all-to-all network topology, if a component wants to communicate with other components, it has to communicate through the controller. The main core interface allows the hardware controller to directly send, receive control signals instead of using interrupt signals.

Figure 17A:
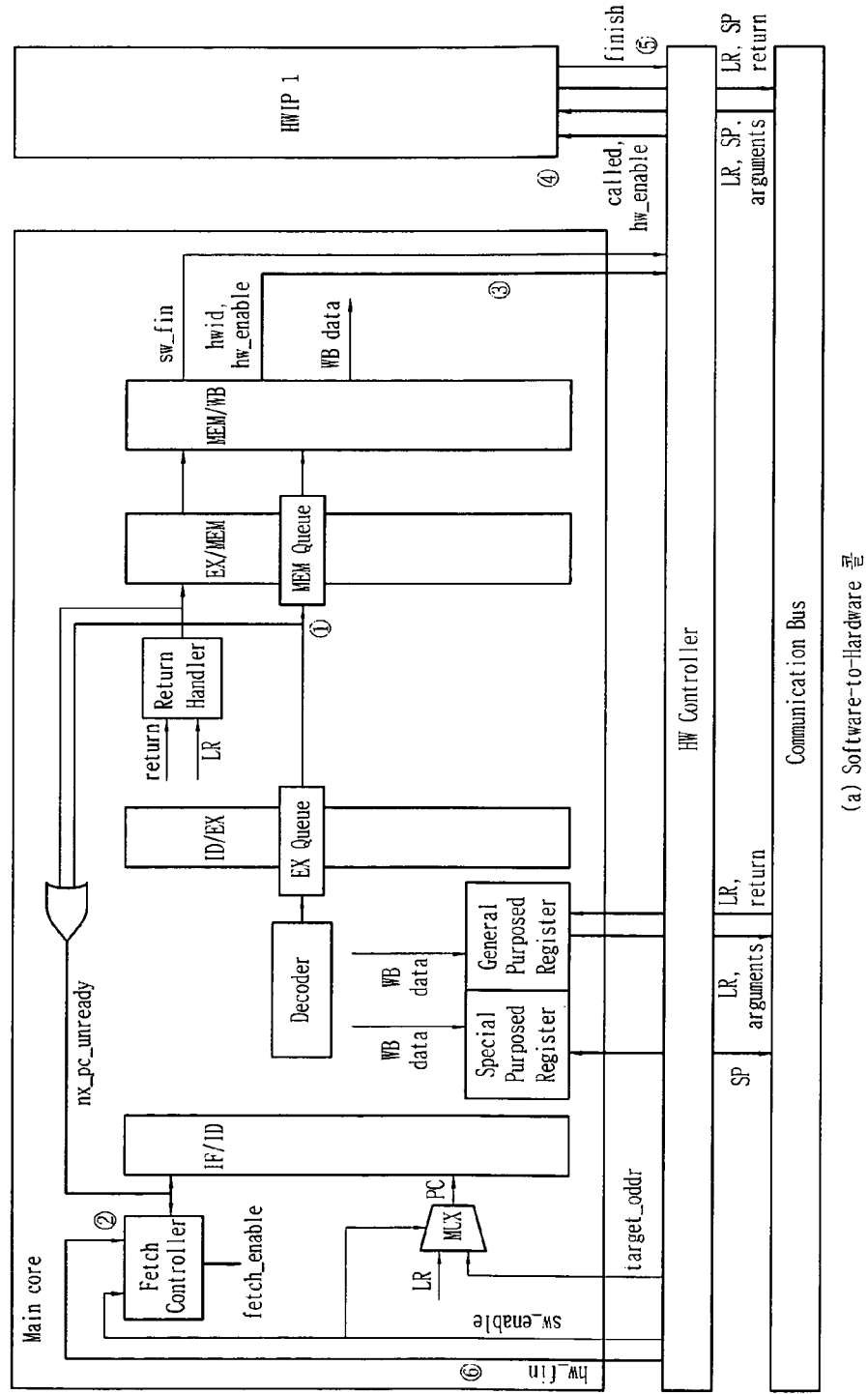
FIG. 17 (a) and (b) are block diagrams showing the cross call implementation of the system in FIG. 16 in case the main core and the dedicated hardware are tightly coupled according to an embodiment of the present invention.
Figure 17B:
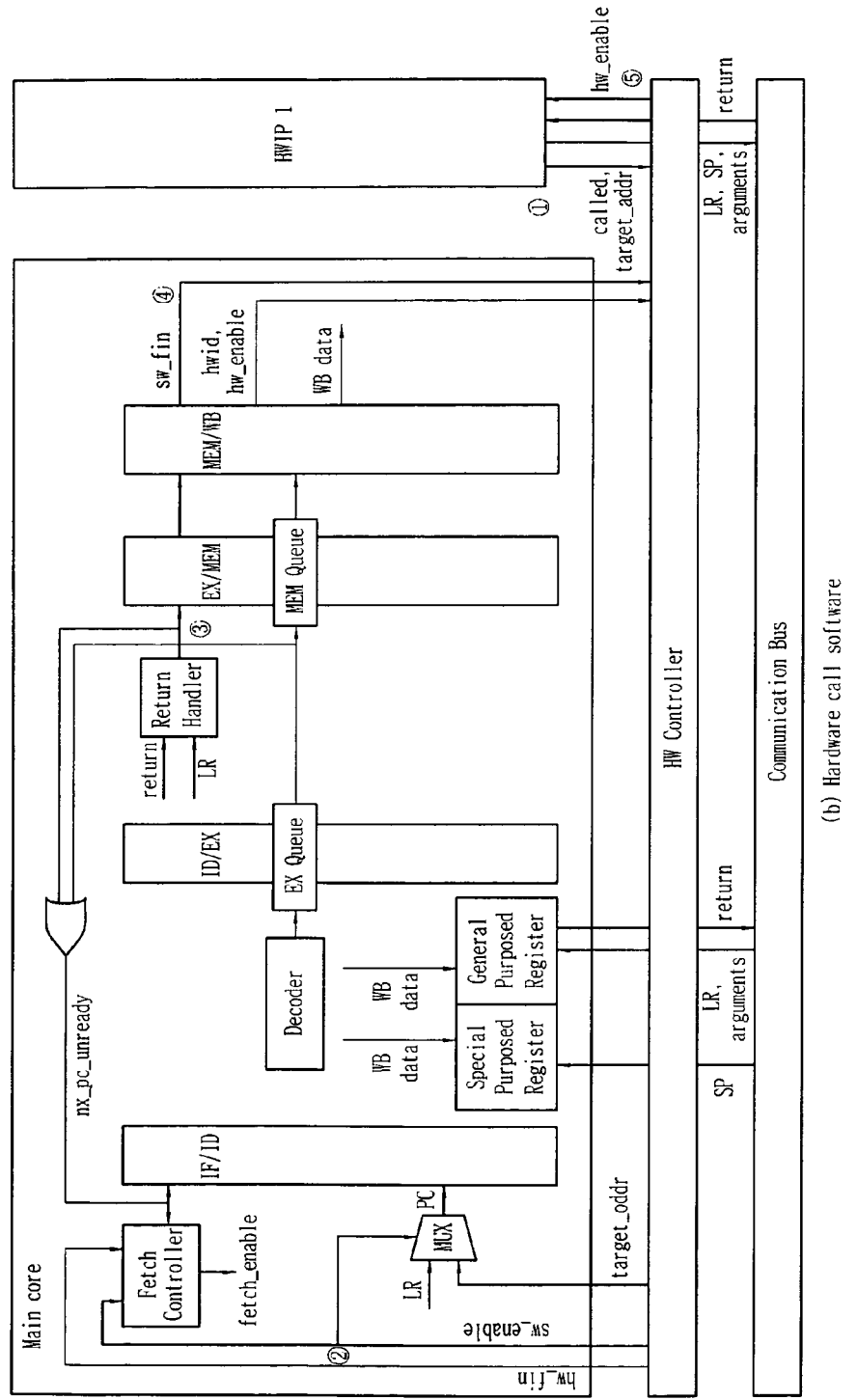

FIG. 17 (a) and (b) are block diagrams showing the cross call implementation of the system in FIG. 16 between a main core and a dedicated hardware in case they are tightly coupled according to an embodiment of the present invention.

In order to reduce the communication overhead, the main core interface is modified for better co-operating with the dedicated hardware. A special instruction, called hcall, is added to the main core's ISA to reduce intermediate steps in performing a software-to-hardware call. When compiling the code, the main compiler checks whether a callee is implemented in hardware or software, if it is a hardware function the compiler automatically generates a hcall instead of a normal function call instruction. The use of the hcall instruction allows the main core to directly perform a software-to-hardware cross call with only one machine instruction. Without modifying the instruction set, the main core must use an intermediate API function like the wrapper in FIG. 14 to communicate with the dedicated hardware which results in higher overhead.

Referring to FIG. 17 (a), the steps to perform a software-to-hardware cross call of the system is numbered from (1) to (6) as following:

When the hcall instruction goes to the execution stage, it triggers an nx_pc_unready signal to stall the main core pipeline (1). The signal forces the Fetch Controller component to stall the instruction fetching process and tells the main core to flush all instructions after the hcall from the pipeline and the instruction queue (2).

When the hcall is committed at the write back stage, an hw_enable signal is sent to the controller together with the callee's hwid to announce about the call; also the next execution address is stored in the link register for return address as a normal call (3).

In the hardware side, the controller actives the called HWIP1 based on the passed hwid value using a hw_enable and a called control signals (4). The activated HWIP1 then copies output values from the main core such as stack pointer, argument registers, link register to its equivalent registers and starts executing. When the HWIP1 finishes, it sends a finish signal to the controller, the controller examines the hardware's return address in the link register to know that the caller is the main core (5). The controller then sends an hw fin signal to announce the main core about its callee finish status (6).

The main core enables its fetching process again, and sets its registers with values from the callee such as stack pointer, link and return registers, etc. After that, the main core continues its execution from the hardware function's return address in the link register.

Referring to FIG. 17 (b), the steps to perform a hardware-to-software cross call of our system is numbered from (1) to (5) as following:

The HWIP1 sends two control signals to the controller: a call signal and a target_addr signal to describe the target address of the called function (1). The HWIP1 also stores the address of its next state in its link register, and arguments in its argument registers and the stack space.

The controller examines the target addr signal to identify the called function is a software function in the main core. The controller sends a sw enable signal to announce the main core about the call from hardware. When called, the main core copies the caller's data from the bus to its registers, sets its program counter register with the target_addr signal value, and enables again the instruction fetching, as shown in FIG. 15 (b) (2), to start executing the software callee.

When the execution of the callee finishes, the main core returns to the HWIP1. When returning to a hardware function, the main core does not jump to that address as in normal software return, but sets the nx_pc_unready signal to stall the instruction fetching and flush the pipeline, (3). And at the write back stage, this hardware return instruction sends a sw_fin signal to the controller, (4).

The controller examines the value of the link register to know that the caller is the HWIP1; it activates the HWIP1 again with an hw_enable signal. The HWIP1 continues it execution (5).

While the present invention has been particularly shown and described with reference to prototype embodiments of high-level language code to HDL code translation method and system, it will be understood by those skilled in the art that various changes in form and details may be made therein without departing from the spirit and scope of the present invention. The prototype embodiments are provided for the purpose of illustrating the invention, not in a limitative sense. Thus, it is intended that the present invention covers the modifications and variations of this invention provided they come within the scope of the appended claims and their equivalents.

What is claimed is:

1. A method of translating a high-level language code into a HDL code, comprising the steps of:
   (1) marking a translation-targeted section of a high-level language code using a programming directive;
   (2) partitioning the marked translation-targeted section of the high-level language code into a hardware code part and remaining sections of the high-level language code as a software code part;
   (3) compiling the software code part and the hardware code part together by means of a main compiler and translating the hardware code part into a HDL code by means of a HLL-to-HDL (high-level language to hardware description language) translator,
   wherein the translation of the hardware code part into the HDL code by means of the HLL-to-HDL comprises the steps of:
       translating the hardware code part into a low-level intermediate representation (IR) code immediately before generation of a target assembly code, and
       translating the low-level IR code into the HDL code, while preserving a standard call linkage convention of a main core; and
   (4) executing the software code part in the main core and executing the HDL code in a dedicated hardware.

2. The method according to claim 1,
   wherein the hardware code part in the step (2) includes one or more of subroutines/functions of the high-level language code, and the software code part includes a subroutine/function call statement or a call instruction to the hardware code part.

3. The method according to claim 1,
   wherein, the code compilation process in the step (3) includes the steps of:
   compiling the software code part and the hardware code part into a target executable code by the main compiler;
   generating a linking log file containing constant data offset by the main compiler;
   generating a symbol table file containing addresses of all software functions and variables inside the software executable code by the main compiler; and
   generating the HDL code of the Hardware code part by the HLL-to-HDL translator by referring to data in the linking log file and the symbol table file.

4. The method according to claim 3,
   wherein, the HLL-to-HDL translator uses the linking log file and the symbol table file for address resolution of the software functions and global variables addresses defined in the software code part, and uses the linking log file together with the symbol table file to resolve the addresses of string constants and the like inside the hardware code part.

5. The method according to claim 1,
wherein
translating the hardware code part into a low-level intermediate representation (IR) code includes using the main compiler.

6. The method according to claim 2,
wherein the HDL code generated from the one or more subroutines/functions of the high-level language code includes:
a datapath which is generated by mapping from the low-level IR to HDL exactly the same as a target assembly code generation; and
a control unit which is generated based on control flow information between basic blocks of the low-level IR code by a HDL code generator inside an HDL back-end of the HLL-to-HDL translator, to control the datapath.

7. The method according to claim 6,
wherein the translation method of the one or more subroutines/functions in the high-level language code into HDL is one of:
a basic-block-by-basic-block generation method in which the generated HDL code includes one or more block modules as the datapath and a top module as the control unit, or
a function-by-function generation method in which the generated HDL code includes one module containing both the datapath and the control unit.

8. The method according to claim 7,
wherein, in the basic-block-by-basic-block code generation method, the one or more block modules perform a same task as the basic blocks of the low-level IR code, and
the top module creates instances of the one or more block modules, and schedules the execution of the one or more block modules by enabling/disabling the one or more block modules.

9. The method according to claim 7,
wherein, in the basic-block-by-basic-block code generation method, the one or more block modules and the top module are generated in the form of a Finite State Machine (FSM), and one of the block modules is a set of FSM states implementing a sequence of consecutive low-level IR instructions inside a basic block, and
a FSM state representation of the FSM states is based on a delay estimation and data/control dependency of the low-level IR instructions.

10. The method according to claim 7, wherein the block modules include register sets,
further wherein, in the basic-block-by-basic-block code generation method, the top module assigns inputs to the one or more block modules, enables one or more block modules at a time, and waits for completion of operation of the enabled block modules,
the enabled block modules execute their own codes with the assigned inputs, buffer outputs in their own register sets, and return the outputs buffered in the register sets as well as a control flow outcome to the top module, and
the top module decides which of the one or more block modules should be enabled next based on the control flow outcome.

11. The method according to claim 7,
wherein, in the function-by-function generation method, both the datapath and the control unit correspond to a hardware function and are included within only one HDL module and implemented as only one Finite State Machine (FSM),
the datapath generates output signals of the FSM and the control unit controls a state transition of the FSM,
the datapath is constructed from all basic blocks of a high-level programming language ,HLL) original function/subroutine and is a set of FSM states generated from low-level IR instructions of basic blocks that correspond to the original HLL subroutine/function, and
the FSM state representation is based on a delay estimation and data/control dependency of the low-level IR instructions.

12. The method according to claim 7,
wherein, in the function-by-function generation method, the control unit controls the datapath by changing a state of a FSM based on control flow information of the one or more translated high-level language subroutines/functions.

13. The method according to claim 2,
wherein, the HDL code includes codes generated from the one or more subroutines/functions of the high-level language code in the step (3) that share a same memory space including a stack with the compiled software code and follow the main core's software stack layout, and
the shared stack space is used to store spilled values, save register files and a return address, pass function arguments between a caller and callee, etc.

14. A method of translating a high-level language code into a HDL code, comprising the steps of:
(1) marking a translation-targeted section of a high-level language code using a programming directive;
(2) partitioning the marked translation-targeted section of the high-level language code into a hardware code part and remaining sections of the high-level language code as a software code part;
(3) compiling the software code part and the hardware code part together by means of a main compiler and translating the hardware code part into a HDL code, that is translated from a high-level programming language (HLL) subroutine/function, by means of a HLL-to-HDL (high-level language to hardware description language) translator; and
(4) executing the software code part in a main core and executing the HDL code in a dedicated hardware,
wherein, the dedicated hardware in the step (4) includes:
a set of HWIPs (hardware intellectual properties), each of which is made from the HDL code that is translated from the HLL subroutine/function, and is assigned with a HWID (hardware identification number) by the HLL-to-HDL translator; and
a hardware controller to control the HWIPs, and
wherein, the HWIDs can be target addresses that are described in a symbol table of the software code part and the hardware code part, or uniquely defined numbers recalculated from the target addresses.

15. The method according to claim 14,
wherein the hardware controller controls the HWIPs by passing arguments between the HWIPs and the main core, and scheduling the execution of the HWIPs and the main core through calling control signals among them,
the hardware controller activates one or several HWIPs or the main core at a time depending on a calling sequence among the HWIPs and the software of software code part running in the main core, and
the hardware controller can be the main core.

16. The method according to claim 1,
wherein, the communication interface between the main core and the dedicated hardware in the step (4) can be implemented in one of two ways which are
loose coupling in which the main core is loosely coupled with the dedicated hardware so that the dedicated hardware can communicate with the main core by interrupting, and
tight coupling in which the main core is tightly coupled with the dedicated hardware so that the dedicated hardware can directly send control signals to the main core, and vice versa.

17. The method according to claim 14,
wherein the step (4) comprises the steps of:
executing the compiled software code part in the main core;
enabling and passing calling data to the hardware controller inside the dedicated hardware by the main core, if the execution of one or several HWIPs is needed during the execution of the compiled software code part;
enabling and passing the calling data to a targeted one or several HWIPs by the hardware controller inside the dedicated hardware;
executing a code of the enabled one or several HWIPs, updating a result of the execution into memory and system registers, and notifying the hardware controller about its/their finishing by the enabled one or several HWIPs;
notifying the main core about the finish of execution of the one or several HWIPs by the hardware controller; and
continuing to execute the compiled software code part with the updated data by the main core.

18. The method according to claim 17,
wherein the calling data to be passed from the main core to the dedicated hardware includes:
system registers including a stack pointer, a link register, argument registers, and other registers depending on the main core; and
control signals including the HWIDs of the targeted one or several HWIPs and an enable signal.

19. The method according to claim 17,
wherein arguments of the targeted one or several HWIPs are passed from the main core using argument registers of the system registers and a shared stack space between the HDL code and the compiled software code.

20. The method according to claim 1,
wherein, in the step (4), the main core communicates with and sends control signals to the dedicated hardware by
implementing a dedicated instruction in its instruction set architecture (ISA) if the main core and the dedicated hardware are tightly coupled, or
calling an intermediate API function for handling communication tasks if the main core and the dedicated hardware are loosely coupled.

21. The method according to claim 17,
wherein, when enabling the hardware controller, the main core updates registers' values of the dedicated hardware with values of its own registers, if the main core and the dedicated hardware are loosely coupled.

22. The method according to claim 17,
wherein, when one of the HWIPs inside the dedicated hardware is enabled by the hardware controller, the enabled HWIP reads the calling data directly from the main core if the main core and the dedicated hardware are tightly coupled, or otherwise the HWIP reads values of registers in the hardware controller.

23. The method according to claim 17,
wherein the hardware controller inside the dedicated hardware notifies the main core about the finish of the HWIP by
interrupting the main core if the main core and the dedicated hardware are loosely coupled, or
sending control signals to the main core if the main core and the dedicated hardware are tightly coupled.

24. The method according to claim 17,
wherein, a HWIP in the dedicated hardware performs a cross call to the compiled software code part running in the main core, and
the cross call process comprises the steps of:
by the HWIP, preparing calling data and sending control signals to tell the hardware controller that it wants to call the compiled software code part;
by the hardware controller, notifying the main core about the call;
by the main core, copying the calling data to its own registers, executing a called compiled software code part of the compiled software code part and notifying the hardware controller when the called compiled code part finishes;
by the hardware controller, notifying the calling HWIP about the finish of the called compiled software code part; and
by the HWIP, continuing to execute its code with results from the called compiled software code part.

25. The method according to claim 24,
wherein, when receiving the control signal from the HWIP, the hardware controller notifies the main core about the call by
interrupting the main core if the main core and the dedicated hardware are loosely coupled, or
directly sending the control signals to the main core if the main core and the dedicated hardware are tightly coupled.

26. The method according to claim 24,
wherein, when enabled, the main core updates its registers with system registers in the hardware controller and writes a software return value and a return address to the registers inside the hardware controller when the called compiled software code part finishes if the main core is loosely coupled with the dedicated hardware,
or otherwise the main core reads input values directly from the calling HWIP.

27. The method according to claim 24,
wherein the HWIP reads a return data and return address of the called compiled software code part from system registers inside the hardware controller if the dedicated hardware and the main core are loosely coupled or otherwise, it reads the values directly from the main core registers.

28. The method according to claim 17,
wherein one HWIP in the dedicated hardware performs a calling process to a different HWIP or itself inside the dedicated hardware, and
the calling process comprises the steps of:
by the one HWIP, preparing calling data and sending control signals to tell the hardware controller that it wants to call the different HWIP or itself inside the dedicated hardware;
by the hardware controller, examining the calling address and enabling the different HWIP or the one HWIP;
by the different HWIP or the one HWIP, copying the calling data to its registers, executing its code and notifying the hardware controller of its finishing time;

by the hardware controller, notifying the one HWIP about the finish of the different HWIP or the one HWIP; and by the one HWIP, continuing to execute its code with results from the different HWIP or the one HWIP.

29. The method according to claim 28, wherein the calling data, which needs to be passed from the one HWIP to the different HWIP or itself, includes the system registers, the system registers including a stack pointer, a link register, argument registers, return registers, and calling control signals including the address of the targeted different HWIP or itself and an enable signal, and if the dedicated hardware and the main core are loosely coupled and all the HWIPs share a set of system registers inside the hardware controller, before calling the different HWIP or the one HWIP, the one HWIP updates the shared system registers in the hardware controller with the calling data.

30. The method according to claim 28, wherein if the different HWIP is called, arguments of the different HWIP are passed from the one HWIP through argument registers and a shared stack space between the HWIPs.

31. The method according to claim 28, wherein, when enabled, the different HWIP updates its registers with system registers in the hardware controller if the dedicated hardware and the main core are loosely coupled and all HWIPs share a set of system registers inside the hardware controller or otherwise the different HWIP reads values directly from the one HWIP.

32. The method according to claim 28, wherein if the different HWIP is called, when the different HWIP finishes, if the dedicated hardware and the main core are loosely coupled and all HWIPs share a set of system registers inside the hardware controller, the different HWIP writes a return value and return address to registers inside the hardware controller.

33. The method according to claim 28, wherein if the different HWIP is called, the one HWIP reads a return data and return address of the different HWIP from the registers in the hardware controller if the dedicated hardware and the main core are loosely coupled and all HWIPs share a set of system registers inside the hardware controller, or otherwise the one HWIP reads the return data and address directly from registers of the different HWIP.

34. A system for translating a high-level language code into a HDL code includes:

a HLL-to-HLL source translator which reads a programming directive from a translation-targeted high-level language code marked with the programming directive, and partitions the translation-targeted high-level language code into a hardware code part and a software code part;

a main compiler which compiles the software code part and the hardware code part together;

a HLL-to-HDL translator which translates the hardware code part into HDL code, the translated HDL code of a function/subroutine in the high-level language code includes a datapath and a control unit;

a main core which executes the compiled software code part; and a dedicated hardware which executes the HDL code in cooperation with the main core, wherein a main compiler front-end and middle-end of the main compiler are included in the HLL-to-HDL translator and translate the hardware code part into a low-level IR code of the main compiler immediately before generation of a target assembly code, and a HDL backend of the HLL-to-HDL translator translates the low-level IR code into the HDL code, while preserving a standard call linkage convention of the main core.

35. The system according to claim 34, wherein the hardware code part includes one or several subroutines/functions of the translation-targeted high-level language code, and the software code part includes the remaining parts of the translation-targeted high-level language code, and function calls to the hardware code part.

36. The system according to claim 34, wherein the HLL-to-HDL translator includes the main compiler front-end and middle-end, and the HDL back-end such that the HLL-to-HDL translator naturally follows a linkage convention of the compiled software code part in HDL code generation, and the HDL backend includes a machine description file to map low-level IR into HDL, whose syntax follows a HDL syntax and semantics, and a HDL code generator.

37. The system according to claim 34, wherein the HDL code of a function/subroutine in the high level language code is generated using a basic-block-by-basic-block generation method in which the generated HDL code includes one or several block modules as the datapath and a top module as the control unit, or a function-by-function generation method in which the generated HDL code includes one module containing both the datapath and the control unit.

38. The system according to claim 34, wherein the datapath corresponds to a hardware function of the HDL code and is generated directly from the low-level IR code by a machine description file of the HDL backend, the control unit corresponds to the hardware function and is generated by a HDL code generator based on control dependence between basic blocks of the low-level IR code, and the datapath and the control unit are implemented using a Finite State Machine form.

39. The system according to claim 37, wherein, in the basic-block-by-basic-block code generation method, a Finite State Machine (FSM) block module of the one or several block modules is a set of FSM states generated from a sequence of consecutive low-level IR instructions inside a basic block of the low-level IR code, a FSM state separation is based on delay estimation and data/control dependency of the low-level IR instructions, the FSM block module performs a same task as a basic block of the low-level IR code, and the top module schedules the execution of the one or several block modules by enabling/disabling the one or several block modules.

40. The system according to claim 37, wherein, in the basic-block-by-basic-block code generation method, the top module assigns inputs to the one or several block modules and enables one or several block modules at a time and waits for completion of the enabled block modules, the enabled block modules execute their own codes with the assigned inputs, buffer outputs in their own register sets, and return the outputs buffered in their own register sets as well as their control flow outcomes to the top module, and the top module decides which of the one or several block modules should be executed next based on the control flow outcomes of the previous enabled block modules.

41. The system according to claim 37, wherein, in the function-by-function code generation method, both the datapath and the control unit of the HDL code generated from a function/subroutine of the high-level language code are included within only one module, and implemented as only one Finite State Machine (FSM), the datapath generates output logic of the FSM while the control unit controls a state transition of the FSM, the datapath is a set of FSM states generated from a sequence of consecutive low-level IR instructions corresponding to all basic blocks inside the HLL function/subroutine, and the FSM state separation is based on a delay estimation and data/control dependency of the low-level IR instructions.

42. A system for translating a high-level language code into a HDL code using a HLL-to-HDL translator, the HLL-to-HDL translator including:

a main compiler front-end and middle-end; and a HDL backend, wherein the HDL backend includes:

a translator, whose syntax follows a HDL syntax and semantics, which maps from the low-level IR to HDL exactly the same as a target assembly code generation; and a HDL generator which generates the HDL code from a low-level IR code translated by the main compiler front-end and middle-end from the high-level language code immediately before a stage of generation of a target assembly code.

43. A system according to claim 42, wherein the HDL code generated by the HLL-to-HDL translator corresponds to a function/subroutine in the high-level language code and includes a datapath and a control unit, and the datapath and the control unit are implemented in Finite State Machine form.

44. A system according to claim 43, wherein the HDL code includes one or several block modules as the datapath and a top module as the control unit and are generated from the function/subroutine in the high-level language code using a basic-block-by-basic-block generation method, or one module containing both the datapath and the control unit using a function-by-function generation method.

45. A system according to claim 44, wherein, in the basic-block-by-basic-block code generation method, the datapath includes one or several block modules, in which a block module is a set of Finite State Machine TSM states generated from low-level IR instructions inside a basic block of the low-level IR code, in the function-by-function generation method, the datapath is a set of FSM states generated from the low-level IR instructions of all basic blocks inside the function/subroutine in the high-level language code, and the FSM state separation of the two methods is based on delay estimation and data dependency of the low-level IR code instructions.

* * * * *